(12) United States Patent
Sutono et al.

(10) Patent No.: US 10,925,152 B2
(45) Date of Patent: Feb. 16, 2021

(54) DIELECTRIC COATING FOR CROSSTALK REDUCTION

(71) Applicant: Intel Corporation, Santa Clara, CA (US)

(72) Inventors: Albert Sutono, Chandler, AZ (US); Xiaoning Ye, Portland, OR (US); Jimmy Hsu, Taoyuan (TW); Daniel Hull, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 16/146,168

(22) Filed: Sep. 28, 2018

(65) Prior Publication Data

US 2019/0045623 A1 Feb. 7, 2019

(51) Int. Cl.
*H05K 1/02* (2006.01)
*H05K 3/34* (2006.01)
(Continued)

(52) U.S. Cl.
CPC ..... *H05K 1/0231* (2013.01); *H01L 23/49816* (2013.01); *H01L 23/5386* (2013.01); *H01L 24/09* (2013.01); *H05K 1/0216* (2013.01); *H05K 1/0243* (2013.01); *H05K 3/3452* (2013.01); *H01L 2223/6627* (2013.01); *H01L 2223/6638* (2013.01); *H01L 2224/16227* (2013.01); *H01L 2924/145* (2013.01); *H01L 2924/1436* (2013.01); *H01L 2924/1438* (2013.01); *H01L 2924/15192* (2013.01); *H01L 2924/15311* (2013.01); *H01L 2924/30105* (2013.01);
(Continued)

(58) Field of Classification Search
CPC .. H05K 1/0231; H05K 1/0216; H05K 1/0243; H05K 1/024; H05K 1/0245; H05K 3/3452; H05K 3/28; H01L 23/49816; H01L 23/5386; H01L 23/5385; H01L 23/645; H01L 23/642; H01L 24/09
See application file for complete search history.

(56) References Cited

U.S. PATENT DOCUMENTS 5,923,232 A * 7/1999 Europa ................. H01P 1/2039
333/204
7,573,359 B2 8/2009 Kunze et al.
(Continued)

*Primary Examiner* — Allen L Parker
*Assistant Examiner* — Gustavo G Ramallo
(74) *Attorney, Agent, or Firm* — Schwabe, Williamson & Wyatt, P.C.

(57) ABSTRACT

Apparatuses, systems and methods associated with dielectric coatings for printed circuit boards are disclosed herein. In embodiments, a printed circuit board (PCB) includes a substrate, microstrip conductors located on a surface of the substrate, a solder mask covering the surface of the substrate and the microstrip conductors, and a dielectric coating located on the solder mask, the dielectric coating on an opposite side of the solder mask from the microstrip conductors, wherein a thickness of the dielectric coating is selected to cause a ratio of capacitive coupling to self capacitance to be approximately equal to a ratio of inductive coupling to self inductance for each microstrip conductor of the microstrip conductors, where the thickness may be determined based on a specific methodology including simulations. Other embodiments may be described and/or claimed.

18 Claims, 16 Drawing Sheets

(51) Int. Cl.
*H01L 23/00* (2006.01)
*H01L 23/538* (2006.01)
*H01L 23/498* (2006.01)
*H05K 3/28* (2006.01)

(52) U.S. Cl.
CPC .... *H01L 2924/30107* (2013.01); *H05K 1/024* (2013.01); *H05K 1/0245* (2013.01); *H05K 3/28* (2013.01); *H05K 2201/09872* (2013.01)

(56) References Cited

U.S. PATENT DOCUMENTS

| | | | |
|---|---|---|---|
| 10,231,325 B1* | 3/2019 | Chengson | H05K 1/0228 |
| 2002/0057137 A1* | 5/2002 | Marketkar | H01P 5/185 |
| | | | 333/24 R |
| 2012/0160542 A1* | 6/2012 | Oluwafemi | H05K 1/0245 |
| | | | 174/250 |
| 2012/0228006 A1* | 9/2012 | Chen | H05K 1/0224 |
| | | | 174/251 |
| 2014/0073196 A1* | 3/2014 | Hashim | H01R 13/6461 |
| | | | 439/676 |
| 2017/0093007 A1* | 3/2017 | Elsherbini | H01P 3/085 |
| 2018/0206339 A1* | 7/2018 | Chen | H05K 1/18 |
| 2019/0069391 A1* | 2/2019 | Sutono | H01P 3/081 |
| 2019/0335578 A1* | 10/2019 | Staudt | H01P 11/003 |

\* cited by examiner

DIELECTRIC COATING FOR CROSSTALK REDUCTION

TECHNICAL FIELD

The present disclosure relates to the field of electronic circuits. More particularly, the present disclosure relates to methods and apparatuses for cancelling or reducing crosstalk on printed circuit boards and semiconductor (multi-chip packages), using dielectric coatings.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As computer technology advances, the frequencies of transmitted signals have increased to allow more data to be transmitted during a time period. Further, distances between transmission elements for conducting the signals have decreased to provide for more efficient use of resource space. However, as the frequencies of the transmitted signals increase and the distances between transmission elements decrease, amounts of crosstalk between transmission elements have increased. The increased crosstalk can result in bit errors in communication links or buses, such as double data rate (DDR), peripheral component interconnect express (PCIe), and Ethernet.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
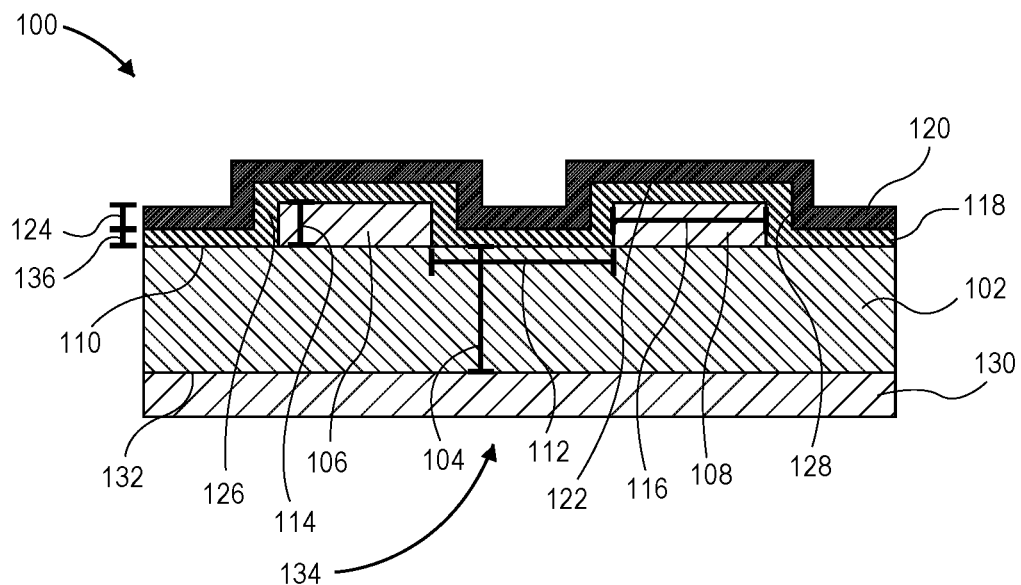
FIG. 1 illustrates a portion of an example printed circuit board (PCB), according to various embodiments.

Apparatuses, systems and methods associated with dielectric coatings for printed circuit boards are disclosed herein. In embodiments, a printed circuit board (PCB) includes a substrate, a pair of microstrip conductors located on a surface of the substrate, a solder mask covering the surface of the substrate and the pair of microstrip conductors, and a dielectric coating located on the solder mask, the dielectric coating on an opposite side of the solder mask from the pair of microstrip conductors, wherein a thickness of the dielectric coating is selected to cause a ratio of capacitive coupling to self capacitance to be approximately equal to a ratio of inductive coupling to self inductance for each microstrip conductor of the pair of microstrip conductors.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a portion of an example printed circuit board (PCB) 100, according to various embodiments. In particular, FIG. 1 illustrates a single substrate with layers located on opposing surfaces of the substrate. It is to be understood that the PCB 100 may include one or more substrates and/or one or more layers in embodiments. Further, the PCB 100 can be utilized in mobile applications, desktop applications, server applications, and/or data center applications. For example, the PCB 100 can be utilized in internet-of-things (IoT) devices, motherboards, and/or smart phones.

The PCB 100 includes a substrate 102. The substrate 102 comprises non-conductive material. The substrate 102 may comprise FR-1, FR-2, FR-3, FR-4, FR-5, or FR-6 substrate materials. For example, the substrate 102 comprises fiberglass, epoxy resin, phenolic paper, phenolic cotton paper, paper, phenol formaldehyde resin, cotton paper impregnated, epoxy, or some combination thereof. The substrate 102 may have a thickness 104. The thickness 104 of the substrate 102 may be approximately (within 25%) uniform for the entirety of the PCB 100.

The PCB 100 includes a first conductor 106 and a second conductor 108. The first conductor 106 and the second conductor 108 comprise conductive material, such as copper, tin, nickel, silver, gold, or some combination thereof. The first conductor 106 and the second conductor 108 comprise microstrip conductors, which may include microstrip traces. The first conductor 106 and the second conductor 108 may be implemented in a single-ended configuration. In embodiments, the first conductor 106 and the second conductor 108 can be configured to conduct signals transmitted via certain protocols, such as DDR, PCIe, universal serial bus (USB), Ethernet, non-volatile memory express (NVMe), and/or serial attached small computer system interface (SAS)/serial advanced technology attachment (SATA). Microstrip conductors are routed along an outer surface of the PCB 100. In particular, microstrip conductors are located on a surface of a first substrate of a PCB without a second substrate of the PCB being located on an opposite side of the microstrip conductors from the first substrate.

In the illustrated embodiment, the first conductor 106 and the second conductor 108 are located on a first surface 110 of the substrate 102. Thicknesses of the first conductor 106 and the second conductor 108 are approximately (within 25%) equal, and may be a thickness 114. Further, the first conductor 106 and the second conductor 108 have approximately (within 25%) the same width 116. In other embodiments, the width of the first conductor 106 and the second conductor 108 may be different. Further, the first conductor 106 and the second conductor 108 may be separated by a distance 112.

The PCB 100 further includes a ground plane 130. The ground plane 130 comprises conductive material, such as copper, tin, nickel, silver, gold, or some combination thereof. The ground plane 130 is located on a second surface 132 of the substrate 102, the second surface 132 being opposite to the first surface 110. The ground plane 130 can extend for an entirety of the second surface 132 of the substrate 102, or some portion of the second surface 132 of the substrate 102.

The ground plane 130 acts as a ground for the first conductor 106 and the second conductor 108. For example, the first conductor 106 and the second conductor 108 may be utilized for transmitting signals. The ground plane 130 may be coupled to a ground of a system in which the PCB 100 is implemented, and may be a ground reference to the signals transmitted on the first conductor 106 and the second conductor 108.

The PCB 100 further includes a solder mask 118. The solder mask 118 comprises a polymer material, such as epoxy liquid, liquid ink photoimageable material, and/or dry film photoimageable material. The solder mask 118 has a thickness 136. The solder mask 118 is located on the first surface 110 of the substrate 102, and on the first conductor 106 and the second conductor 108. In particular, the first conductor 106 and the second conductor 108 are located between the substrate 102 and the solder mask 118. Further, the solder mask 118 extends across the substrate 102, the first conductor 106, and the second conductor 108. The substrate 102 abuts each of the first conductor 106 and the second conductor 108 on one side and the solder mask 118 abuts each of the first conductor 106 and the second conductor 108 on three sides. The solder mask 118 may act as a protective coating to reduce the chances of damage to the substrate 102, the first conductor 106, and the second conductor 108. In some embodiments, the solder mask 118 may be omitted.

The PCB 100 further includes a dielectric coating 120. The dielectric coating 120 comprises a dielectric material, such as polymeric material, acrylics, polyurethanes, silicones, or some combination thereof. The dielectric coating 120 is located on a surface 122 of the solder mask 118. The dielectric coating 120 extends across the solder mask 118. Further, the dielectric coating 120 is located on an opposite side of the solder mask 118 from the substrate 102, the first conductor 106, and the second conductor 108.

The dielectric coating 120 has a thickness 124 that is approximately (within 25%) uniform across the first conductor 106 and the second conductor 108. In some embodiments, the thickness 124 of the dielectric coating 120 may be between 0.5 mils and 10 mils. For example, the thickness 124 is approximately uniform from a sidewall 126 of the solder mask 118 on a side of the first conductor 106 that is opposite to the second conductor 108 to a sidewall 128 of the solder mask 118 on a side of the second conductor 108 that is opposite to the first conductor 106.

The thickness 124 of the dielectric coating 120 is selected based on a capacitive coupling, a self capacitance, an inductive coupling, and a self inductance of each of the first conductor 106 and the second conductor 108. In particular, the thickness 124 of the dielectric coating 120 is selected to cause a ratio of the capacitive coupling to self capacitance for each of the first conductor 106 and the second conductor 108 to be approximately (within 25%) equal to a ratio of inductive coupling to self inductance for each of the first conductor 106 and the second conductor 108. The capacitive coupling, the self capacitance, the inductive coupling, and the self inductance can be determined for a single-ended configuration of the first conductor 106 and the second conductor 108. Selecting the thickness 124 of the dielectric coating 120 to cause the ratio of the capacitive coupling to self capacitance for each of the first conductor 106 and the second conductor 108 to be approximately (within 25%) equal to the ratio of inductive coupling to self inductance for each of the first conductor 106 and the second conductor 108 may reduce an amount of far end crosstalk (FEXT) among signals conducted by the first conductor 106 and the second conductor 108. In particular, an amount of FEXT generated by signals conducted by the first conductor 106 and the second conductor 108 is defined by the equation:

$$k_f \propto \frac{C_m}{C} - \frac{L_m}{L}$$

where $k_f$ is the amount of FEXT, $C_m$ is the capacitive coupling between the first conductor 106 and the second conductor 108, C is the self capacitance of each of the first conductor 106 and the second conductor 108, $L_m$ is the inductive coupling between the first conductor 106 and the second conductor 108, and L is the self inductance of each of the first conductor 106 and the second conductor 108. As can be perceived from the equation, selecting the ratio of the capacitive coupling to the self capacitance to be approximately (within 25%) equal to the ratio of inductive coupling to self inductance causes the amount of FEXT to be or approach zero.

The capacitive coupling, the self capacitance, the inductive coupling, and the self inductance can be determined based on the thickness 104 and dielectric constant of the substrate 102, the distance 112 between the first conductor 106 and the second conductor 108, the thickness 114 of the first conductor 106 and the second conductor 108, the width 116 of the first conductor 106 and the second conductor 108, the thickness 136 and dielectric constant of the solder mask 118, a dielectric constant for the dielectric coating 120, or some combination thereof. Accordingly, the thickness 124 of the dielectric coating 120 can be determined based on the thickness 104 and dielectric constant of the substrate 102, the distance 112 between the first conductor 106 and the second conductor 108, the thickness 114 of the first conductor 106 and the second conductor 108, the width 116 of the first conductor 106 and the second conductor 108, the thickness 136 and dielectric constant of the solder mask 118, a dielectric constant for the dielectric coating 120, or some combination thereof. In some embodiments, a simulator (such as a circuit simulator) can be configured to determine the thickness 124 of the dielectric coating 120 that produces a lowest amount of FEXT. For example, the simulator can be configured to determine the thickness 124 of the dielectric coating 120 with the first conductor 106 and the second conductor 108 being implemented in a single-ended configuration.

In embodiments where the PCB 100 includes additional conductors, substrates, and/or layers, the additional conductors, substrates, and/or layers may be located on a side 134 of the ground plane 130. In particular, the additional substrates and layers may be located on the side 134 of the ground plane 130 that is opposite to the substrate 102.

Figure 2:
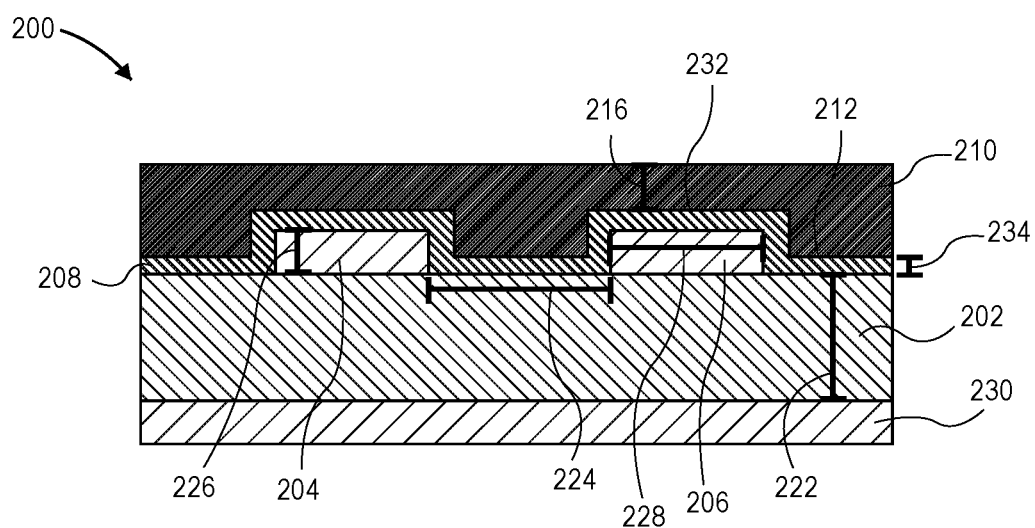
FIG. 2 illustrates a portion of another example PCB, according to various embodiments.

FIG. 2 illustrates a portion of another example PCB 200, according to various embodiments. The PCB 200 includes one or more of the features of the PCB 100 (FIG. 1). In particular, the PCB 200 includes a substrate 202, a first conductor 204, a second conductor 206, a solder mask 208, and a ground plane 230. The substrate 202 includes the features of the substrate 102 (FIG. 1). The first conductor 204 includes the features of the first conductor 106 (FIG. 1). The second conductor 206 includes the features of the second conductor 108 (FIG. 1). The solder mask 208 includes the features of the solder mask 118 (FIG. 1). The ground plane 230 includes the features of the ground plane 130 (FIG. 1). Further, the positional relationships among the substrate 202, the first conductor 204, the second conductor 206, the solder mask 208, and the ground plane 230 are the same as the positional relationships among the substrate 102, the first conductor 106, the second conductor 108, the solder mask 118, and the ground plane 130, respectively. Further, the solder mask 208 may be omitted in some embodiments.

The PCB 200 further includes a dielectric coating 210. The dielectric coating 210 comprises a dielectric material, such as polymeric material, acrylics, polyurethanes, silicones, or some combination thereof. The dielectric coating 210 is located on a surface 212 of the solder mask 208. The dielectric coating 210 extends across the solder mask 208. Further, the dielectric coating 210 is located on an opposite side of the solder mask 208 from the substrate 202, the first conductor 204, and the second conductor 206.

The dielectric coating 210 has approximately (within 25%) a uniform thickness 216 from a surface 232 of a portion of the solder mask 208 on the first conductor 204 and/or the second conductor 206. The thickness 216 may be between 0.5 mils and 10 mils. The thickness 216 is selected based on a capacitive coupling, a self capacitance, an inductive coupling, and a self inductance of each of the first conductor 204 and the second conductor 206. In particular, the thickness 216 is selected to cause a ratio of the capacitive coupling to self capacitance for each of the first conductor 204 and the second conductor 206 to be equal to a ratio of inductive coupling to self inductance for each of the first conductor 204 and the second conductor 206, as further described in relation to FIG. 1. The capacitive coupling, the self capacitance, the inductive coupling, and the self inductance can be determined for a single-ended configuration of the first conductor 204 and the second conductor 206. The capacitive coupling, the self capacitance, the inductive coupling, and the self inductance can be determined based on a thickness 222 and dielectric constant of the substrate 202, a distance 224 between the first conductor 204 and the second conductor 206, the thickness 226 of the first conductor 204 and the second conductor 206, the width 228 of the first conductor 204 and the second conductor 206, a thickness 234 and dielectric constant of the solder mask 208, a dielectric constant of the dielectric coating 210, or some combination thereof. Accordingly, the thickness 216 can be determined based on the thickness 222 of the substrate 202, the distance 224 between the first conductor 204 and the second conductor 206, the thickness 226 of the first conductor 204 and the second conductor 206, the width 228 of the first conductor 204 and the second conductor 206, a thickness 234 and dielectric constant of the solder mask 208, a dielectric constant of the dielectric coating 210, or some combination thereof. In some embodiments, a simulator (such as a circuit simulator) can be configured to determine the thickness 216 of the dielectric coating 210 that produces a lowest amount of FEXT. For example, the simulator can be configured to determine the thickness 216 of the dielectric coating 210 with the first conductor 204 and the second conductor 206 being implemented in a single-ended configuration.

Figure 3:
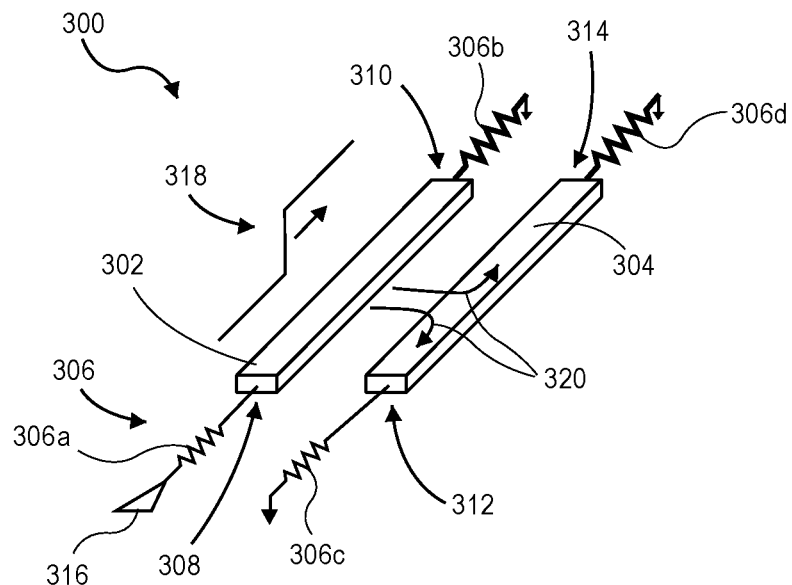
FIG. 3 illustrates an example representation illustrating capacitive coupling between microstrip conductors, according to various embodiments.

FIG. 3 illustrates an example representation 300 illustrating capacitive coupling between microstrip conductors, according to various embodiments. In particular, the representation 300 illustrates a procedure that may be utilized for determining the capacitive coupling between two microstrip conductors. For example, the procedure may be utilized for determining an amount of capacitive coupling between the first conductor 106 (FIG. 1) and the second conductor 108 (FIG. 1), and for determining an amount of capacitive coupling between the first conductor 204 (FIG. 2) and the second conductor 206 (FIG. 2).

The representation 300 includes a first conductor 302 and a second conductor 304. The first conductor 302 includes one or more of the features of the first conductor 106 and/or the first conductor 204. Further, the second conductor 304 includes one or more of the features of the second conductor 108 and/or the second conductor 206. In the illustrated embodiment, the first conductor 302 and the second conductor 304 extend parallel to each other. In other embodiments, the first conductor 302 and the second conductor 304 can extend in different directions.

The representation 300 further includes a plurality of resistors 306. The plurality of resistors 306 include a first resistor 306a coupled to a first end 308 of the first conductor 302, a second resistor 306b coupled to a second end 310 of the first conductor 302, a third resistor 306c coupled to a first end 312 of the second conductor 304, and a fourth resistor 306d coupled to a second end 314 of the second conductor 304. Each of the plurality of resistors 306 represents resistances experienced at each end of the conductors. In particular, the first resistor 306a represents resistance experienced at the first end 308 of the first conductor 302 due to components that may be coupled to the first end 308 of the first conductor 302. The second resistor 306b represents resistance experienced at the second end 310 of the first conductor 302 due to components that may be coupled to the second end 310 of the first conductor 302. The third resistor 306c represents resistance experienced at the first end 312 of the second conductor 304 due to components that may be coupled to the first end 312 of the second conductor 304. The fourth resistor 306d represents resistance experienced at the second end 314 of the second conductor 304 due to components that may be coupled to the second end 314 of the second conductor 304. In other embodiments, the amount of the resistance of each of the plurality of resistors 306 may be selected to allow a certain amount of current to be conducted by the conductors, or the plurality of resistors 306 may be omitted.

The representation 300 further includes a driver 316. The driver 316 is coupled to the first resistor 306a. The driver 316 may provide a signal 318 to the first end 308 of the first conductor 302 via the first resistor 306a. As the signal 318 is conducted via the first conductor 302, a current (as represented by arrows 320) may be induced in the second conductor 304 due to capacitive coupling with the first conductor 302. An amount of the capacitive coupling can be determined based on the current induced in the second conductor 304, the value of the plurality of resistors, or some combination thereof.

Figure 4:
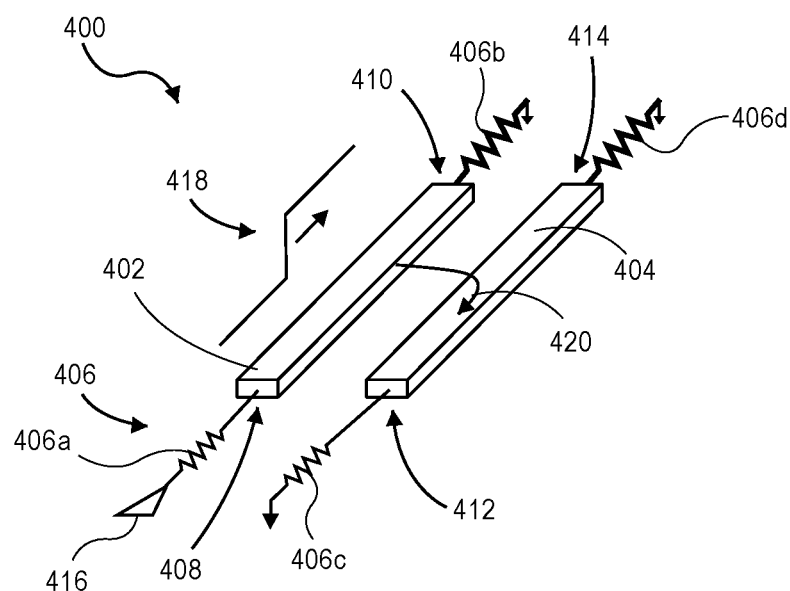
FIG. 4 illustrates an example representation illustrating inductive coupling between microstrip conductors, according to various embodiments.

FIG. 4 illustrates an example representation 400 illustrating inductive coupling between microstrip conductors, according to various embodiments. In particular, the representation 400 illustrates a procedure that may be utilized for determining the inductive coupling between two microstrip conductors. For example, the procedure may be utilized for determining an amount of inductive coupling between the first conductor 106 (FIG. 1) and the second conductor 108 (FIG. 1), and for determining an amount of inductive coupling between the first conductor 204 (FIG. 2) and the second conductor 206 (FIG. 2).

The representation 400 includes a first conductor 402 and a second conductor 404. The first conductor 402 includes one or more of the features of the first conductor 106 and/or the first conductor 204. Further, the second conductor 404 includes one or more of the features of the second conductor 108 and/or the second conductor 206. In the illustrated embodiment, the first conductor 402 and the second conductor 404 extend parallel to each other. In other embodiments, the first conductor 402 and the second conductor 404 can extend in different directions.

The representation 400 further includes a plurality of resistors 406. The plurality of resistors 406 include a first resistor 406a coupled to a first end 408 of the first conductor 402, a second resistor 406b coupled to a second end 410 of the first conductor 402, a third resistor 406c coupled to a first end 412 of the second conductor 404, and a fourth resistor 406d coupled to a second end 414 of the second conductor 404. Each of the plurality of resistors 406 represents resistances experienced at each end of the conductors. In particular, the first resistor 406a represents resistance experienced at the first end 408 of the first conductor 402 due to components that may be coupled to the first end 408 of the first conductor 402. The second resistor 406b represents resistance experienced at the second end 410 of the first conductor 402 due to components that may be coupled to the second end 410 of the first conductor 402. The third resistor 406c represents resistance experienced at the first end 412 of the second conductor 404 due to components that may be coupled to the first end 412 of the second conductor 404. The fourth resistor 406d represents resistance experienced at the second end 414 of the second conductor 404 due to components that may be coupled to the second end 414 of the second conductor 404. In other embodiments, the amount of the resistance of each of the plurality of resistors 406 may be selected to allow a certain amount of current to be conducted by the conductors, or the plurality of resistors 406 may be omitted.

The representation 400 further includes a driver 416. The driver 416 is coupled to the first resistor 406a. The driver 416 may provide a signal 418 to the first end 408 of the first conductor 402 via the first resistor 406a. As the signal 418 is conducted via the first conductor 402, a voltage (as represented by arrow 420) may be induced in the second conductor 404 due to inductive coupling with the first conductor 402. An amount of the inductive coupling can be determined based on the voltage induced in the second conductor 404, the value of the plurality of resistors, or some combination thereof.

Figure 5:
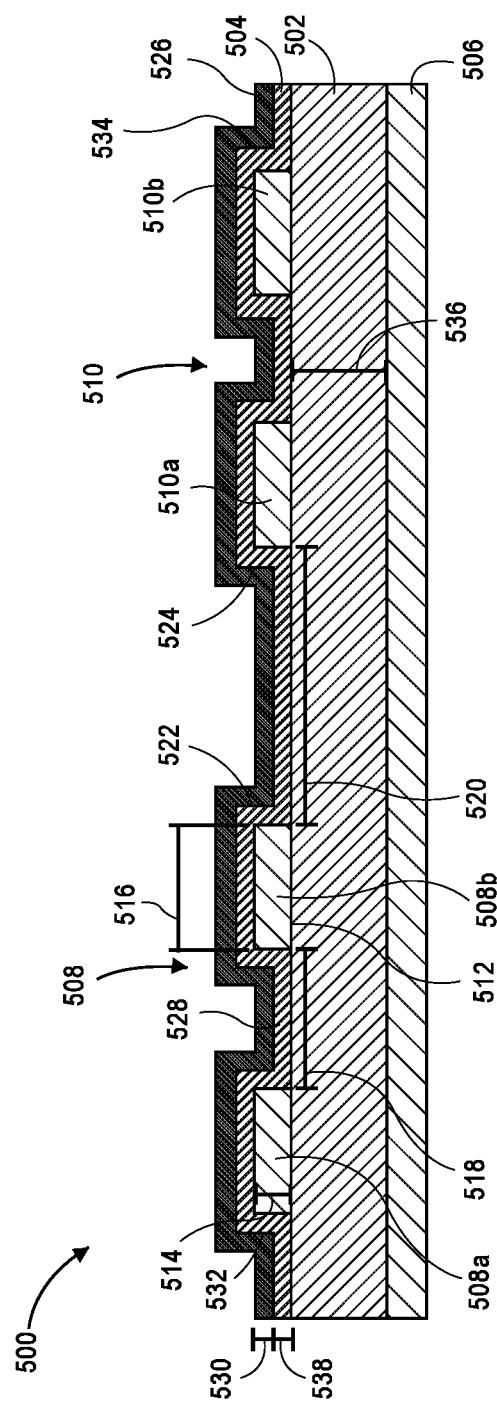
FIG. 5 illustrates a portion of another example PCB, according to various embodiments.

FIG. 5 illustrates a portion of another example PCB 500, according to various embodiments. The PCB 500 includes one or more of the features of the PCB 100 (FIG. 1) and/or PCB 200 (FIG. 2). In particular, the PCB 500 includes a substrate 502, a solder mask 504, and a ground plane 506. The substrate 502 includes the features of the substrate 102 (FIG. 1) and/or the substrate 202 (FIG. 2). The solder mask 504 includes the features of the solder mask 118 (FIG. 1)

and/or the solder mask 208 (FIG. 2). The ground plane 506 includes the features of the ground plane 130 (FIG. 1) and/or the ground plane 230 (FIG. 2). Further, the positional relationships among the substrate 502, the solder mask 504, and the ground plane 506 are the same as the positional relationships among the substrate 102, the solder mask 118, and the ground plane 130, respectively.

The PCB 500 further includes a first pair of conductors 508 and a second pair of conductors 510. The first pair of conductors 508 and the second pair of conductors 510 may be implemented in a differential configuration. The first pair of conductors 508 and the second pair of conductors 510 comprise conductive material, such as copper, tin, nickel, silver, gold, or some combination thereof. The first pair of conductors 508 and the second pair of conductors 510 comprise pairs microstrip conductors in differential configuration, where each conductor may carry electrical signals having the same magnitude but opposite polarity. Microstrip conductors are routed along an outer surface of the PCB 500. In particular, microstrip conductors are located on a surface of a first substrate of a PCB with the ground plane 506 as a reference plane.

In the illustrated embodiment, the first pair of conductors 508 and the second pair of conductors 510 are located on a surface 512 of the substrate 502. Thicknesses of each conductor of the first pair of conductors 508 and the second pair of conductors 510 are approximately (within 25%) equal, and may be a thickness 514. Further, each conductor of the first pair of conductors 508 and the second pair of conductors 510 have approximately (within 25%) the same width 516. In other embodiments, the width of one or more of the conductors of the first pair of conductors 508 and the second pair of conductors 510 may be different from other conductors of the first pair of conductors 508 and/or the second pair of conductors 510.

The first pair of conductors 508 includes a first conductor 508*a* and a second conductor 508*b*. Further, the second pair of conductors 510 includes a first conductor 510*a* and a second conductor 510*b*. The first conductor 508*a* and the second conductor 508*b* of the first pair of conductors 508 are separated by a distance 518. The first conductor 510*a* and the second conductor 510*b* of the second pair of conductors 510 are separated by approximately (within 25%) the same distance 518 by which the first conductor 508*a* and the second conductor 508*b* are separated. In other embodiments, the distance between the first conductor 508*a* and the second conductor 508*b* of the first pair of conductors 508 may be different from the distance between the first conductor 510*a* and the second conductor 510*b* of the second pair of conductors 510.

The first pair of conductors 508 is separated from the second pair of conductors 510 by a distance 520. In particular, a side 522 of the second conductor 508*b* closest to the second pair of conductors 510 is located the distance 520 away from a side 524 of the first conductor 510*a* closest to the first pair of conductors 508.

Further, the solder mask 504 is located on the surface 512 of the substrate 502, and on the first pair of conductors 508 and the second pair of conductors 510. In particular, the first pair of conductors 508 and the second pair of conductors 510 are located between the substrate 502 and the solder mask 504. The solder mask 504 has a thickness 538. Further, the solder mask 504 extends across the substrate 502, the first pair of conductors 508, and the second pair of conductors 510. The substrate 502 abuts each conductor of the first pair of conductors 508 and the second pair of conductors 510 on one side and the solder mask 504 abuts each conductor of the first pair of conductors 508 and the second pair of conductors 510 on three sides. The solder mask 504 may act as a protective coating to reduce the chances of damage to the substrate 502, the first pair of conductors 508, and the second pair of conductors 510. In some embodiments, the solder mask 504 may be omitted.

The PCB 500 further includes a dielectric coating 526. The dielectric coating 526 comprises a dielectric material, such as polymeric material, acrylics, polyurethanes, silicones, or some combination thereof. The dielectric coating 526 is located on a surface 528 of the solder mask 504. The dielectric coating 526 extends across the solder mask 504. Further, the dielectric coating 526 is located on an opposite side of the solder mask 504 from the substrate 502, the first pair of conductors 508, and the second pair of conductors 510.

The dielectric coating 526 has a thickness 530 that is approximately (within 25%) uniform across the first pair of conductors 508 and the second pair of conductors 510. In some embodiments, the thickness 530 of the dielectric coating 526 may be between 0.5 mils and 10 mils. For example, the thickness 530 is approximately uniform from a sidewall 532 of the solder mask 504 on a side of the first conductor 508*a* that is opposite to the second pair of conductors 510 to a sidewall 534 of the solder mask 504 on a side of the second conductor 510*b* that is opposite to the first pair of conductors 508.

The thickness 530 of the dielectric coating 526 is selected based on a capacitive coupling, a self capacitance, an inductive coupling, and a self inductance of each conductor of the first pair of conductors 508 and the second pair of conductors 510. In particular, the thickness 530 of the dielectric coating 526 is selected to cause a ratio of the capacitive coupling to self capacitance for each conductor of the first pair of conductors 508 and the second pair of conductors 510 to be approximately (within 25%) equal to a ratio of inductive coupling to self inductance for each conductor of the first pair of conductors 508 and the second pair of conductors 510. The capacitive coupling, the self capacitance, the inductive coupling, and the self inductance may be determined for a differential configuration of the first pair of conductors 508 and the second pair of conductors 510. Selecting the thickness 530 of the dielectric coating 526 to cause the ratio of the capacitive coupling to self capacitance for each conductor of the first pair of conductors 508 and the second pair of conductors 510 to be approximately (within 25%) equal to the ratio of inductive coupling to self inductance for each conductor of the first pair of conductors 508 and the second pair of conductors 510 may reduce an amount of FEXT among signals conducted by the first pair of conductors 508 and the second pair of conductors 510. In particular, an amount of FEXT generated by signals conducted by the conductors of the first pair of conductors 508 and the second pair of conductors 510 is defined by the equation:

$$k_f \propto \frac{C_{m-diff}}{C} - \frac{L_{m-diff}}{L}$$

where $k_f$ is the amount of FEXT, $C_{m-diff}$ is the differential capacitive coupling, C is the self capacitance of each conductor of the first pair of conductors 508 and the second pair of conductors 510, $L_{m-diff}$ is the differential inductive coupling, and L is the self inductance of each conductor of the first pair of conductors 508 and the second pair of conductors 510. As can be perceived from the equation, selecting the ratio of the capacitive coupling to the self capacitance to be approximately (within 25%) equal to the ratio of inductive coupling to self inductance causes the amount of FEXT to be or approach zero.

The capacitive coupling, the self capacitance, the inductive coupling, and the self inductance can be determined based on the thickness 536 and dielectric constant of the substrate 502, the distance 518 between the conductors within each pair of conductors, the distance 520 between the first pair of conductors 508 and the second pair of conductors 510, the thickness 510 of each of the conductors of the first pair of conductors 508 and the second pair of conductors 510, the width 516 of each of the conductors of the first pair of conductors 508 and the second pair of conductors 510, the thickness 538 and dielectric constant of the solder mask 504, a dielectric constant of the dielectric coating 526, or some combination thereof. Accordingly, the thickness 530 of the dielectric coating 526 can be determined based on the thickness 536 and dielectric constant of the substrate 502, the distance 518 between the conductors within each pair of conductors, the distance 520 between the first pair of conductors 508 and the second pair of conductors 510, the thickness 510 of each of the conductors of the first pair of conductors 508 and the second pair of conductors 510, the width 516 of each of the conductors of the first pair of conductors 508 and the second pair of conductors 510, the thickness 538 and the dielectric constant of the solder mask 504, the dielectric constant of the dielectric coating 526, or some combination thereof. In some embodiments, a simulator (such as a circuit simulator) can be configured to determine the thickness 530 of the dielectric coating 526 that produces a lowest amount of FEXT. For example, the simulator can be configured to determine the thickness 530 of the dielectric coating with the first pair of conductors 508 and the second pair of conductors 510 being implemented in a differential configuration.

Figure 6:
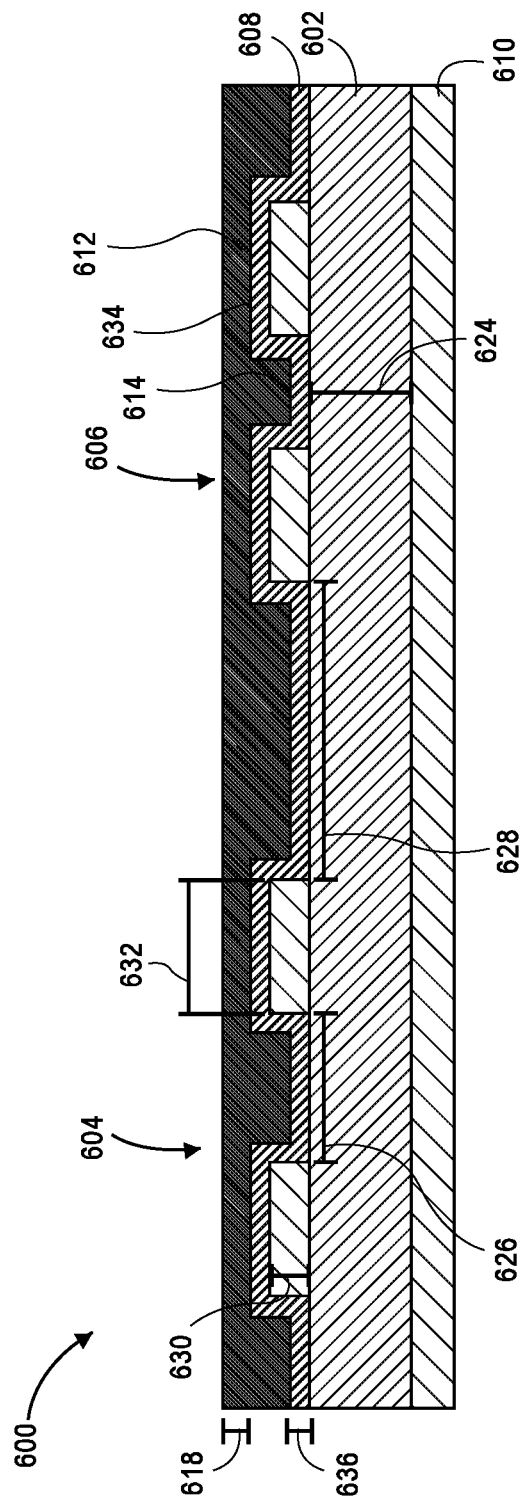
FIG. 6 illustrates a portion of another example PCB, according to various embodiments.

FIG. 6 illustrates a portion of another example PCB 600, according to various embodiments. The PCB 600 includes one or more of the features of the PCB 500 (FIG. 5). In particular, the PCB 600 includes a substrate 602, a first pair of conductors 604, a second pair of conductors 606, a solder mask 608, and a ground plane 610. The substrate 602 includes the features of the substrate 502 (FIG. 5). The first pair of conductors 604 includes the features of the first pair of conductors 508 (FIG. 5). The second pair of conductors 606 includes the features of the second pair of conductors 510 (FIG. 5). The solder mask 608 includes the features of the solder mask 504 (FIG. 5). The ground plane 610 includes the features of the ground plane 506 (FIG. 5). Further, the positional relationships among the substrate 602, the first pair of conductors 604, the second pair of conductors 606, the solder mask 608, and the ground plane 610 are the same as the positional relationships among the substrate 502, the first pair of conductors 508, the second pair of conductors 510, the solder mask 504, and the ground plane 506, respectively. Further, the solder mask 608 may be omitted in some embodiments.

The PCB 600 further includes a dielectric coating 612. The dielectric coating 612 comprises a dielectric material, such as polymeric material, acrylics, polyurethanes, silicones, or some combination thereof. The dielectric coating 612 is located on a surface 614 of the solder mask 608. The dielectric coating 612 extends across the solder mask 608. Further, the dielectric coating 612 is located on an opposite side of the solder mask 608 from the substrate 602, the first pair of conductors 604, and the second pair of conductors 606.

The dielectric coating 612 has approximately (within 25%) a uniform thickness 618 from a surface 634 on the first pair of conductors 604 and/or the second pair of conductors 606. The thickness 618 may be between 0.5 mils and 10 mils. The thickness 618 is selected based on a capacitive coupling, a self capacitance, an inductive coupling, and a self inductance of each conductor of the first pair of conductors 604 and the second pair of conductors 606. In particular, the thickness 618 is selected to cause a ratio of the capacitive coupling to self capacitance for each conductor of the first pair of conductors 604 and the second pair of conductors 606 to be equal to a ratio of inductive coupling to self inductance for each conductor of the first pair of conductors 604 and the second pair of conductors 606, as further described in relation to FIG. 5. The capacitive coupling, the self capacitance, the inductive coupling, and the self inductance can be determined based on the thickness 624 and dielectric constant of the substrate 602, a distance 626 between the conductors within each pair of conductors, a distance 628 between the first pair of conductors 604 and the second pair of conductors 606, a thickness 630 of each of the conductors of the first pair of conductors 604 and the second pair of conductors 606, the width 632 of each of the conductors of the first pair of conductors 604 and the second pair of conductors 606, a thickness 636 and dielectric constant of the solder mask 608, a dielectric constant of the dielectric coating 612, or some combination thereof. Accordingly, the thickness 618 can be determined based on the thickness 624 and dielectric constant of the substrate 602, a distance 626 between the conductors within each pair of conductors, a distance 626 between the first pair of conductors 604 and the second pair of conductors 606, a thickness 630 of each of the conductors of the first pair of conductors 604 and the second pair of conductors 606, the width 632 of each of the conductors of the first pair of conductors 604 and the second pair of conductors 606, the thickness 636 and the dielectric constant of the solder mask 608, the dielectric constant of the dielectric coating 608, or some combination thereof.

Figure 7:
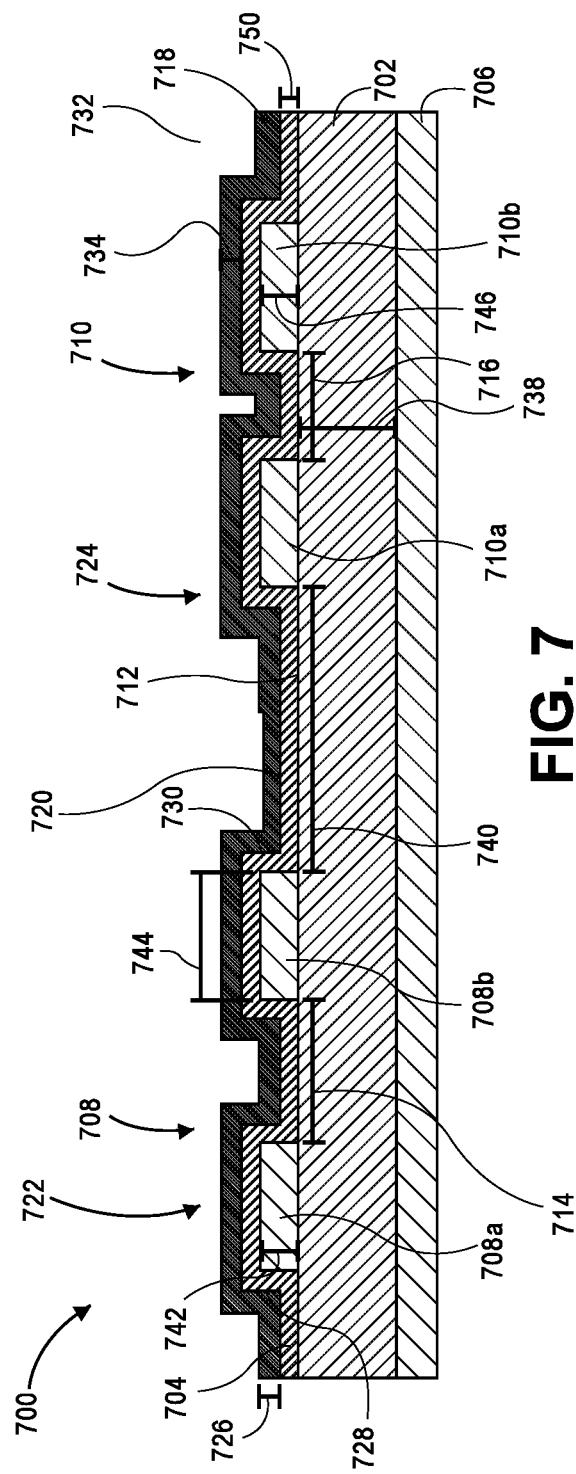
FIG. 7 illustrates a portion of another example PCB, according to various embodiments.

FIG. 7 illustrates a portion of another example PCB 700, according to various embodiments. The PCB 700 includes one or more of the features of the PCB 500 (FIG. 5) and/or the PCB 600 (FIG. 6). In particular, the PCB 700 includes a substrate 702, a solder mask 704, and a ground plane 706. The substrate 702 includes the features of the substrate 502 (FIG. 5) and/or the substrate 602 (FIG. 6). The solder mask 704 includes the features of the solder mask 504 (FIG. 5) and/or the solder mask 608 (FIG. 6). The ground plane 706 includes the features of the ground plane 506 (FIG. 5) and/or the ground plane 610 (FIG. 6). Further, the positional relationships among the substrate 702, the solder mask 704, and the ground plane 706 are the same as the positional relationships among the substrate 502, the solder mask 504, and the ground plane 506, respectively. Further, the solder mask 704 may be omitted in some embodiments.

The PCB 700 further includes a first pair of conductors 708 and a second pair of conductors 710. The first pair of conductors 708 and the second pair of conductors 710 may be implemented in a differential configuration. The first pair of conductors 708 and the second pair of conductors 710 comprise conductive material, such as copper, tin, nickel, silver, gold, or some combination thereof. The first pair of conductors 708 and the second pair of conductors 710 comprise microstrip conductors. Microstrip conductors are routed along an outer surface of the PCB 700. In particular, microstrip conductors are located on a surface of a first substrate of a PCB without a second substrate of the PCB being located on an opposite side of the microstrip conductors from the first substrate. In the illustrated embodiment, the first pair of conductors 708 and the second pair of conductors 710 are located on a surface 712 of the substrate 702.

The first pair of conductors 708 includes a first conductor 708a and a second conductor 708b. Further, the second pair of conductors 710 includes a first conductor 710a and a second conductor 710b. The first conductor 708a and the second conductor 708b of the first pair of conductors 708 are separated by a first distance 714. The first conductor 710a and the second conductor 710b of the second pair of conductors 710 are separated by a second distance 716, the second distance 716 being different from the first distance 714. In other embodiments, the first conductor 708a and the second conductor 708b of the first pair of conductors 708 are separated by a same distances as the first conductor 710a and the second conductor 710b of the second pair of conductors 710 are separated.

The PCB 700 further includes a dielectric coating 718. The dielectric coating 718 comprises a dielectric material, such as polymeric material, acrylics, polyurethanes, silicones, or some combination thereof. The dielectric coating 718 is located on a surface 720 of the solder mask 704. The dielectric coating 718 extends across the solder mask 704. Further, the dielectric coating 718 is located on an opposite side of the solder mask 704 from the substrate 702, the first pair of conductors 708, and the second pair of conductors 710.

A thickness of the dielectric coating 718 varies in the illustrated embodiment. In particular, a first portion 722 of the dielectric coating 718 that extends across the first pair of conductors 708 may have a thickness less than a thickness of a second portion 724 of the dielectric coating 718 that extends across the second pair of conductors 710. The thickness of the dielectric coating 718 varies based on the protocol of the communication links or buses to be transmitted on the first pair of conductors 708 and the second pair of conductors 710 in the illustrated embodiments. In particular, the first pair of conductors 708 may be configured to support a first communication link or bus having a first protocol and the second pair of conductors 710 may be configured to support a second communication link or bus having a second protocol that is different from the first protocol. In other embodiments, other differences (such as differences in distance between the conductors, differences in thicknesses of the conductors, differences in the width of the conductors, and/or differences in the thickness and/or composition of the portions of the substrate 702 located adjacent to each pair of conductors) may cause the thickness of the dielectric coating 718 to be varied.

The first portion 722 of the dielectric coating 718 has a thickness 726 that is approximately (within 25%) uniform across the first pair of conductors 708. In some embodiments, the thickness 726 of the first portion 722 of the dielectric coating 718 may be between 05 mils and 10 mils. For example, the thickness 726 is approximately uniform from a sidewall 728 of the solder mask 704 on a side of the first conductor 708a that is opposite from the second conductor 708b to a sidewall 730 of the solder mask 704 on a side of the second conductor 708b that is opposite to the first conductor 708a. The thickness 726 is selected based on a capacitive coupling, a self capacitance, an inductive coupling, and a self inductance of each conductor of the first pair of conductors 708. In particular, the thickness 726 is selected to cause a ratio of the capacitive coupling to self capacitance for each conductor of the first pair of conductors 708 to be equal to a ratio of inductive coupling to self inductance for each conductor of the first pair of conductors 708. The capacitive coupling, the self capacitance, the inductive coupling, and the self inductance can be determined based on the thickness 738 and dielectric constant of the substrate 702, the distance 714 between the conductors within the first pair of conductors 708, a distance 740 between the first pair of conductors 708 and the second pair of conductors 710, a thickness 742 of each of the conductors of the first pair of conductors 708, a width 744 of each of the conductors of the first pair of conductors 708, a thickness 750 and dielectric constant of the solder mask 704, a dielectric constant for the dielectric coating 718, or some combination thereof. Accordingly, the thickness 726 can be determined based on the thickness 738 and dielectric constant of the substrate 702, a distance 714 between the conductors within the first pair of conductors 708, a distance 740 between the first pair of conductors 708 and the second pair of conductors 710, a thickness 742 of each of the conductors of the first pair of conductors 708, the width 744 of each of the conductors of the first pair of conductors 708, the thickness 750 and the dielectric constant of the solder mask 704, the dielectric constant for the dielectric coating 704, or some combination thereof.

The second portion 724 of the dielectric coating 718 has a thickness 734 that is approximately (within 25%) uniform across the second pair of conductors 710. Further, a thickness 734 may be between 0.5 mils and 10 mils. The thickness 734 is selected based on a capacitive coupling, a self capacitance, an inductive coupling, and a self inductance of each conductor of the second pair of conductors 710. In particular, the thickness 734 is selected to cause a ratio of the capacitive coupling to self capacitance for each conductor of the second pair of conductors 710 to be equal to a ratio of inductive coupling to self inductance for each conductor of the second pair of conductors 710. The capacitive coupling, the self capacitance, the inductive coupling, and the self inductance can be determined based on the thickness 738 and the dielectric constant of the substrate 702, the distance 716 between the conductors within the second pair of conductors 710, the distance 740 between the first pair of conductors 708 and the second pair of conductors 710, a thickness 746 of each of the conductors of the second pair of conductors 710, a width 748 of each of the conductors of the second pair of conductors 710, a thickness 750 and dielectric constant of the solder mask 704, the dielectric constant of the dielectric coating 718 or some combination thereof. Accordingly, the thickness 734 can be determined based on the thickness 738 and the dielectric constant of the substrate 702, the distance 716 between the conductors within the second pair of conductors 710, the distance 740 between the first pair of conductors 708 and the second pair of conductors 710, the thickness 746 of each of the conductors of the second pair of conductors 710, the width 748 of each of the conductors of the second pair of conductors 710, the thickness 750 and dielectric constant of the solder mask 704, the dielectric constant for the dielectric coating 718, or some combination thereof.

Figure 8:
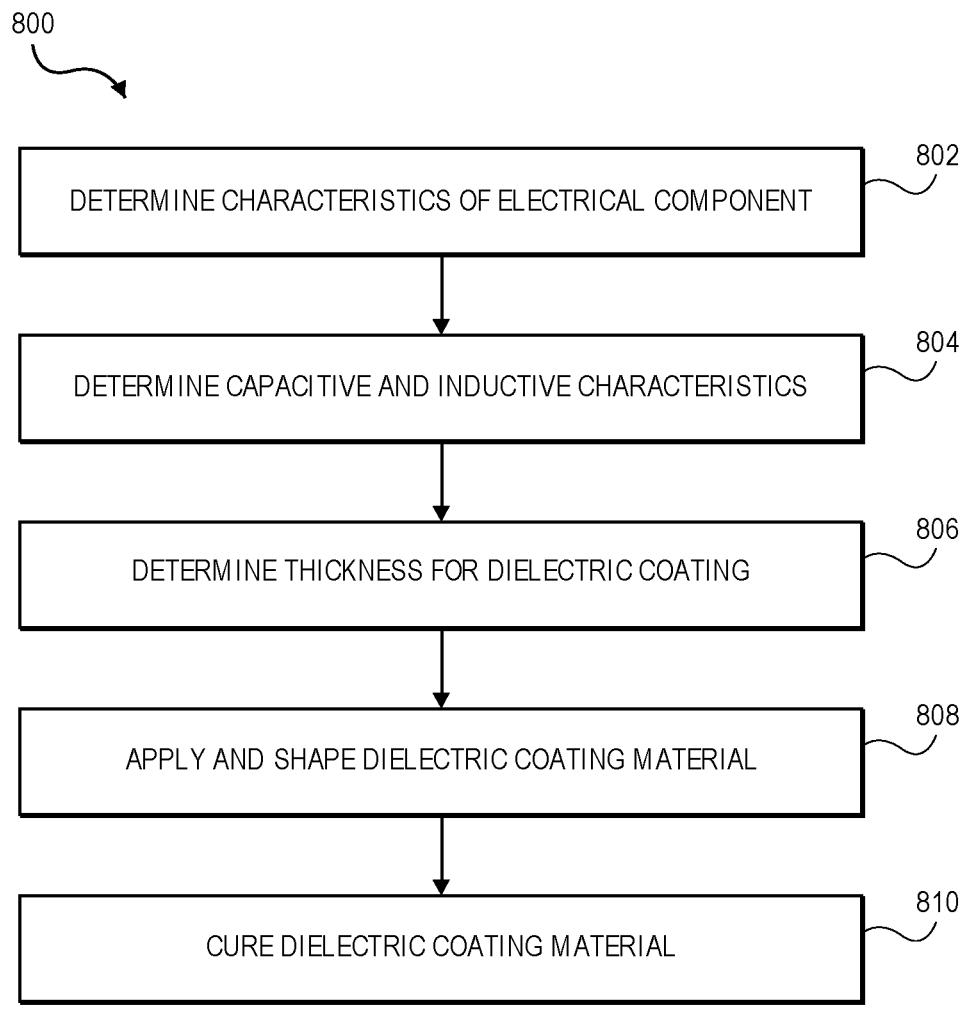
FIG. 8 illustrates an example procedure for determining a thickness of dielectric coating and applying the dielectric coating to an electrical component, according to various embodiments.
Figure 15:
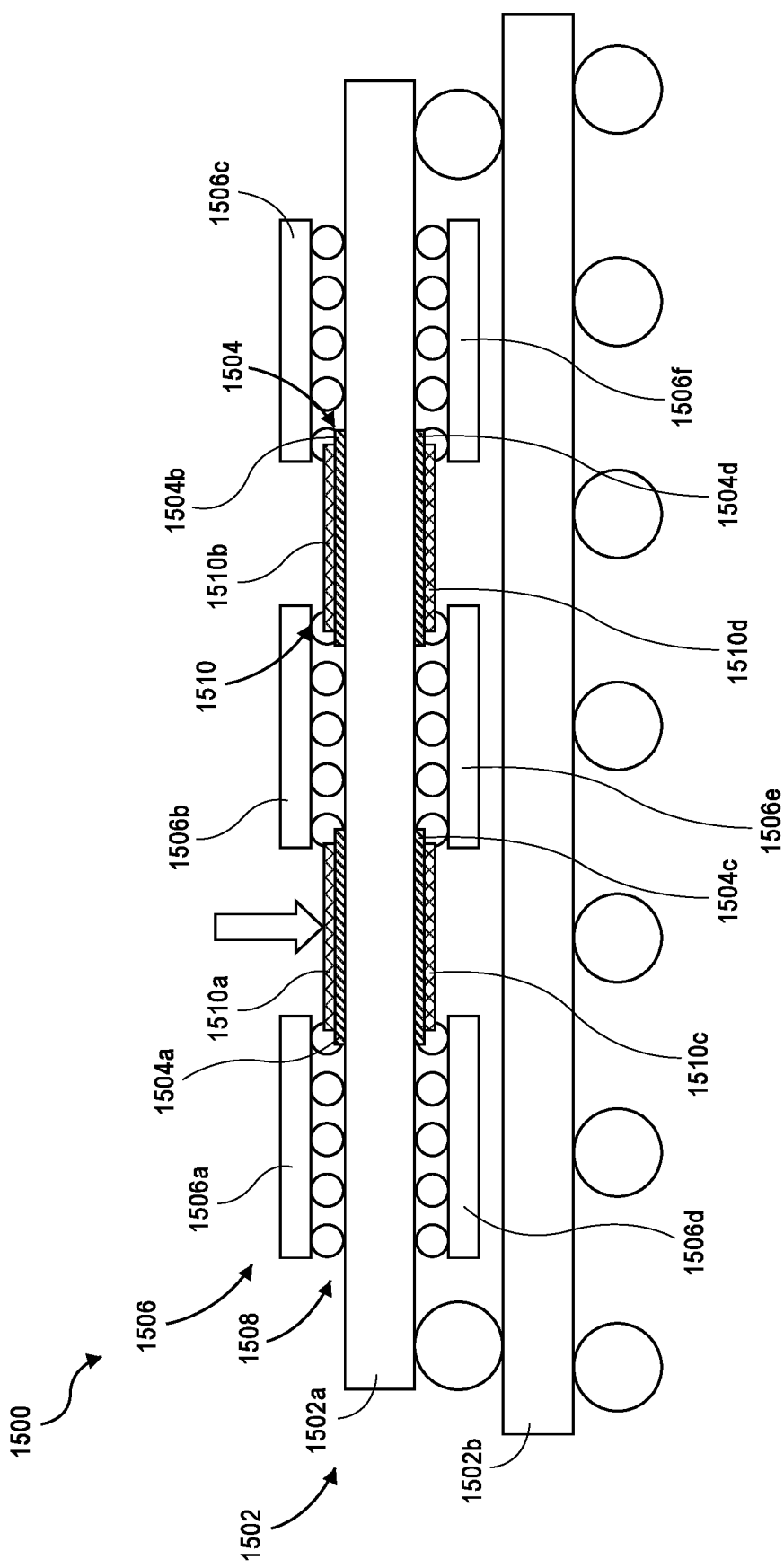
FIG. 15 illustrates an example semiconductor package, according to various embodiments.

FIG. 8 illustrates an example procedure 800 for determining a thickness of dielectric coating and applying the dielectric coating to an electrical component (such as a PCB and/or a semiconductor package), according to various embodiments. In particular, the procedure 800 can be performed to produce the dielectric coatings described herein, including the dielectric coating 120 (FIG. 1), the dielectric coating 210 (FIG. 2), the dielectric coating 526 (FIG. 5), the dielectric coating 612 (FIG. 6), the dielectric coating 718 (FIG. 7), and the dielectric coatings 1510 (FIG. 15).

In stage 802, one or more characteristics of an electrical component are determined. Determining the characteristics of the electrical component includes identifying one or more pairs of microstrip conductors. Further, determining the characteristics of the electrical component includes determining a thickness of a substrate on which the pairs of microstrip conductors are formed, thicknesses of the microstrip conductors, widths of the microstrip conductors, distances between the conductors in the pairs of microstrip conductors, distances between the pairs of microstrip conductors, or some combination thereof. The electrical component may be an electrical component that has already been produced or may be an electrical component that is planned to be produced.

In stage 804, capacitive and inductive characteristics are determined. The capacitive and inductive characteristics include capacitive coupling, self capacitance, inductive coupling, and self inductance. In particular, the capacitive and inductive characteristics are determined for each conductor within the pairs of conductors. The capacitive and inductive characteristics may be determined based on one or more of the characteristics of the electrical component determined in stage 802. For example, the equations described in relation to FIG. 1 and FIG. 5, respectively, may be utilized to determine the capacitive and inductive characteristics.

In other embodiments, a signal-integrity simulation tool and/or an electronic design automation tool can be utilized to determine the capacitive and inductive characteristics. In particular, one or more of the characteristics of the electrical component can be provided to the signal-integrity simulation tool and/or the electronic design automation tool, and the signal-integrity simulation tool and/or the electronic design automation tool determines the capacitive and inductive characteristics based on the provided one or more of the characteristics.

In stage 806, a thickness for the dielectric coating is determined. The thickness of the dielectric coating can be determined based on the procedure for determining the dielectric thickness of single-ended configured conductors (described in relation to FIG. 1 and FIG. 2) or the procedure for determining the dielectric thickness of differential configured conductors (described in relation to FIG. 5, FIG. 6, and FIG. 7). The thickness is determined by determining a thickness of the dielectric coating that causes a ratio of the capacitive coupling to self capacitance to be equal to a ratio of inductive coupling to self inductance for each of the pairs of conductors with the dielectric coating applied. The thickness of the dielectric coating may vary based on differences in the capacitive coupling, the self capacitance, the inductive coupling, the self inductance, or some combination thereof, for each of the pair of conductors.

In other embodiments, the thickness of the dielectric coating can be determined based on simulations performed by the signal-integrity simulation tool and/or the electronic design automation tool (collectively referred to as "the simulation tool" or "the simulator"). For example, the characteristics of the electrical component determined in stage 802 are input into the simulation tool. Further, a dielectric coating is simulated on the surface of the electrical component within the simulation tool, where the thickness of the dielectric coating can be stepped through a certain range (such as from 0 millimeters to 7 millimeters with a 1 millimeter increment) during simulation. The simulation tool produces one or more indications of the FEXT that would be produced by each thickness of the dielectric coating, where the thickness for the dielectric coating can be selected to be the thickness that would produce the least FEXT.

In stage 808, the dielectric coating is applied to the surface of the electrical component. In particular, the dielectric coating can be applied to the surface of the electrical component toward which the microstrip conductors are located. The dielectric coating can be shaped to the determined thickness and shape of the dielectric coating when being applied.

In stage 810, the dielectric coating is cured. Curing the dielectric coating can include letting the dielectric coating cool to room temperature, heating the dielectric coating, applying a chemical to the dielectric coating, applying light to the dielectric coating, drying the dielectric coating, or some combination thereof. Curing the dielectric coating can cause the dielectric coating to harden.

Figure 9A:
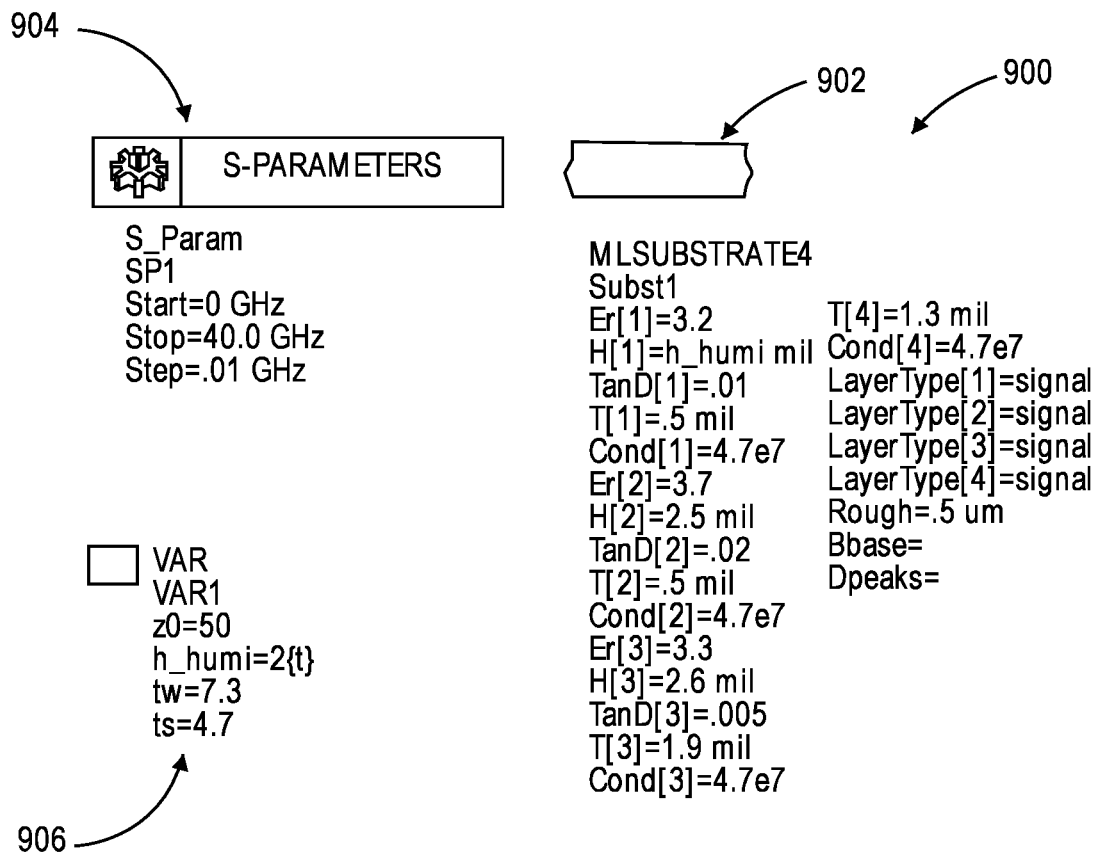
FIG. 9A illustrates a first portion of a representation of an electrical component, as utilized by a simulation tool for simulation tool-based dielectric coating thickness determination procedure, according to various embodiments.

FIG. 9A illustrates a first portion of a representation 900 of an electrical component (such as the PCB 100 (FIG. 1) and/or the PCB 200 (FIG. 2)), as utilized by a simulation tool for simulation tool-based dielectric coating thickness determination procedure, according to various embodiments. The representation 900 can be utilized to determine the dielectric coating thickness for conductors to be implemented in a single-ended configuration.

The representation 900 includes substrate definition information 902. The substrate definition information 902 includes information defining characteristics of a substrate, such as the substrate 102 (FIG. 1) and/or the substrate 202 (FIG. 2). For example, the substrate information 902 defines a thickness of the substrate and a dielectric constant of the substrate.

The representation 900 further includes simulation parameter information 904. The simulation parameter information 904 includes information defining the simulation to be performed by the simulation tool. For example, the simulation parameter information 904 defines a frequency range and a size of increment for frequencies of signals to be applied to conductors of the representation 900 to produce an output of the simulation.

The representation 900 further includes variable information 906. The variable information 906 includes information defining characteristics of a dielectric coating (such as the dielectric coating 120 (FIG. 1) and/or the dielectric coating 210 (FIG. 2)) to be formed on the electrical component. For example, the variable information 906 includes a dielectric constant of the dielectric coating, and a thickness range and size of increment for thicknesses of the dielectric coating to be tested.

Figure 9B:
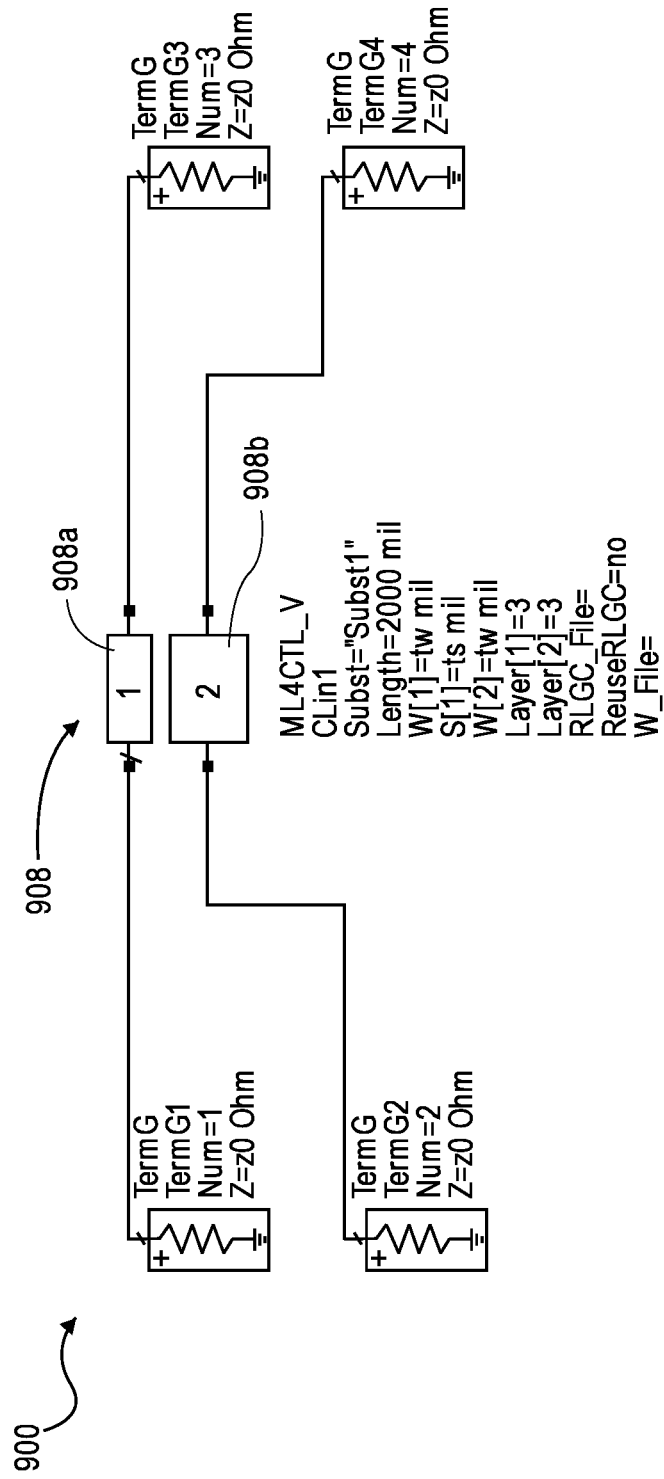
FIG. 9B illustrates a second portion of the representation of FIG. 9A, according to various embodiments.

FIG. 9B illustrates a second portion of the representation 900 of FIG. 9A, according to various embodiments. The representation 900 further includes conductor information 908. The conductor information 908 includes information related to a first conductor (such as the first conductor 106 (FIG. 1) and/or the first conductor 204 (FIG. 2)) and a second conductor (such as the second conductor 108 (FIG. 1) and/or the second conductor 206 (FIG. 2)). In particular, the conductor information 908 includes a representation 908a of the first conductor and a representation 908b of the second conductor. The conductor information 908 includes thicknesses of the first conductor and the second conductor, widths of the first conductor and the second conductor, a distance between the first conductor and the second conductor, or some combination thereof.

Figure 10:
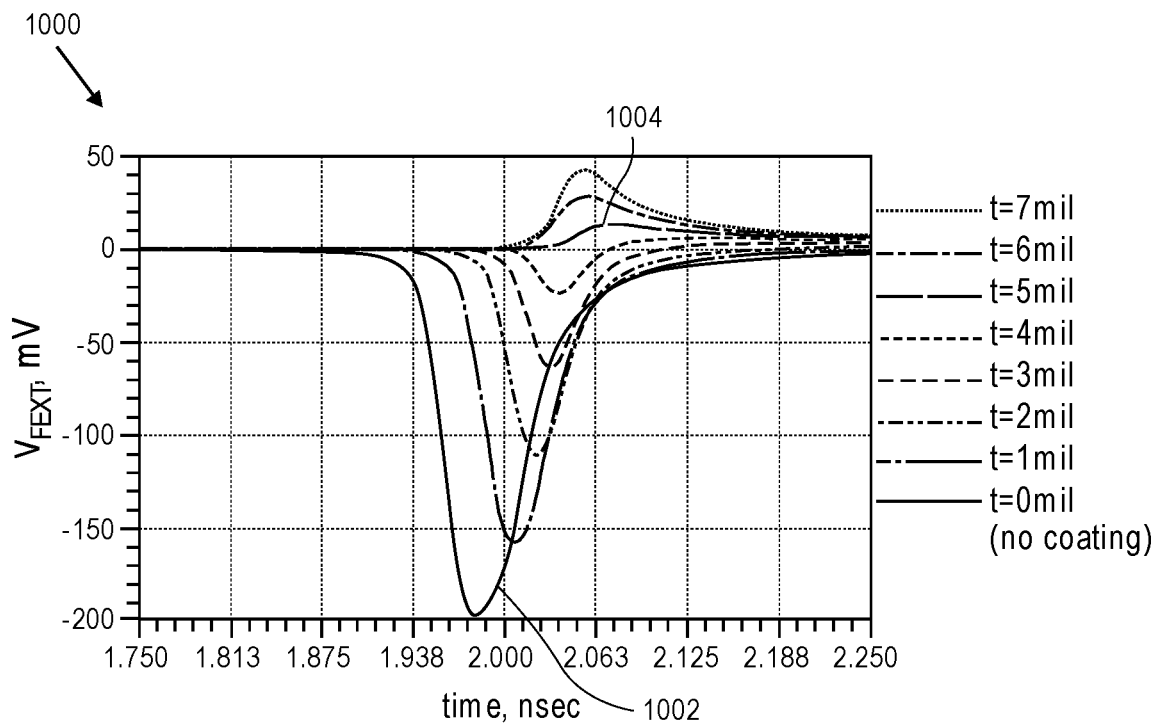
FIG. 10 illustrates a graphical representation of a result of the simulation tool-based dielectric coating thickness determination procedure for the representation of FIGS. 9A and 9B, according to various embodiments.

FIG. 10 illustrates a graphical representation 1000 of a result of the simulation tool-based dielectric coating thickness determination procedure for the representation 900 of FIGS. 9A and 9B, according to various embodiments. In particular, the graphical representation 1000 illustrates an amount of FEXT in millivolts (mV) experienced by the conductors versus time based on the simulation described in relation to FIG. 9. The graphical representation 1000 illustrates the results of the simulation for thicknesses of the dielectric coating between 0 millimeters and 7 millimeters. The graphical representation 1000 can be produced by the simulation tool.

The graphical representation 1000 includes a line 1002 that illustrates the amount of FEXT experienced by the conductors when the thickness of the dielectric coating is zero millimeters, which is equivalent to no dielectric coating being applied. As can be seen by the line 1002, the amount of FEXT experienced by the conductors when there is no dielectric coating peaks at approximately −200 mV.

As can be seen from the graphical representation 1000, the amount of FEXT can be reduced toward 0 mV as the thickness of the dielectric coating is varied. In the illustrated embodiment, a thickness of the dielectric coating equal to 5 millimeters, represented by line 1004, presents the lowest amount of FEXT experienced by the conductors. In particular, the conductors experience an amount of FEXT with a peak of approximately 10 mV when the dielectric coating has a thickness equal to 5 millimeters. Based on the dielectric coating of 5 millimeters presenting the lowest amount of FEXT, the thickness for the dielectric coating to be applied to the PCB is determined to be 5 millimeters.

Figure 11:
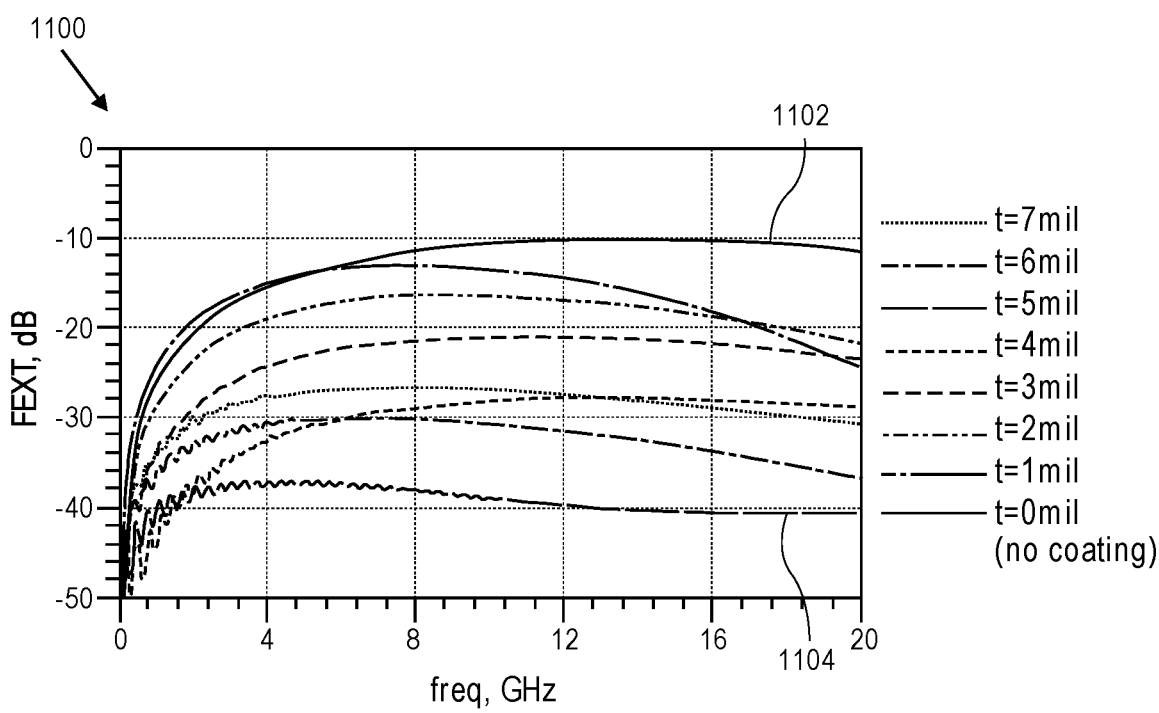
FIG. 11 illustrates another graphical representation of a result of the simulation tool-based dielectric coating thickness determination procedure for the representation of FIGS. 9A and 9B, according to various embodiments.

FIG. 11 illustrates another graphical representation 1100 of a result of the simulation tool-based dielectric coating thickness determination procedure for the representation 900 of FIGS. 9A and 9B, according to various embodiments. In particular, the graphical representation 1100 illustrates an amount of FEXT in decibels (dB) experienced by the conductors versus the frequency of the signal applied to the conductors based on the simulation described in relation to FIGS. 9A and 9B. The graphical representation 1100 illustrates the results of the simulation for thicknesses of the dielectric coating between 0 millimeters and 7 millimeters. The graphical representation 1100 can be produced by the simulation tool.

The graphical representation 1100 includes a line 1102 that illustrates the amount of FEXT experienced by the conductors when the thickness of the dielectric coating is zero millimeters, which is equivalent to no dielectric coating being applied. As can be seen by the line 1102, the amount of FEXT experienced by the conductors approaches −10 dB for higher frequencies of signals being applied to the conductors.

As can be seen from the graphical representation 1100, the amount of FEXT can be reduced as the thickness of the dielectric coating is varied. In the illustrated embodiment, a thickness of the dielectric coating equal to 5 millimeters, represented by line 1104, presents the lowest amount of FEXT experienced by the conductors. In particular, the conductors experience an amount of FEXT around −40 dB when the dielectric coating has a thickness equal to 5 millimeters. Based on the dielectric coating of 5 millimeters presenting the lowest amount of FEXT, the thickness for the dielectric coating to be applied to the PCB is determined to be 5 millimeters.

Figure 12A:
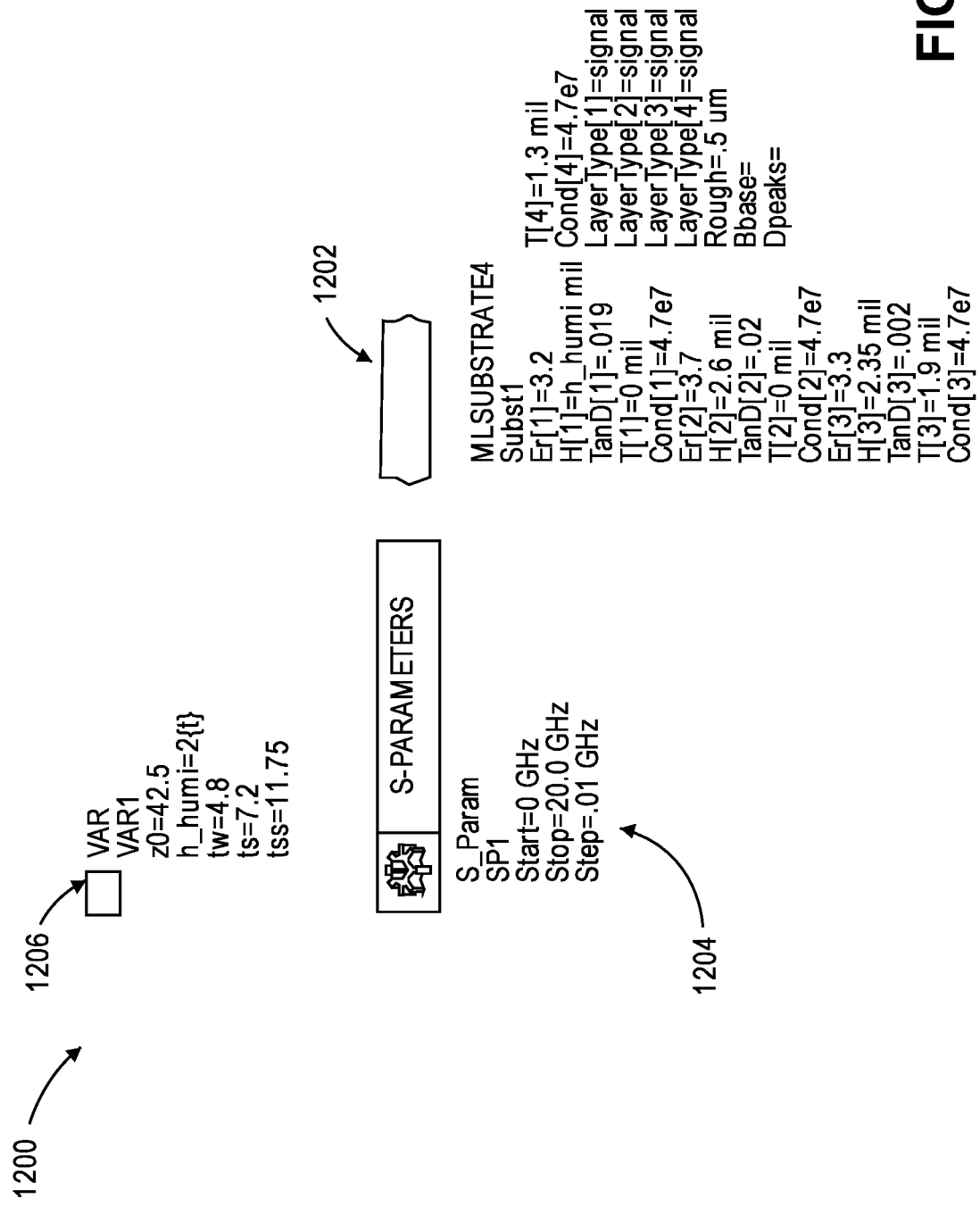
FIG. 12A illustrates a first portion of a representation of an electrical component, as utilized by a simulation tool for simulation tool-based dielectric coating thickness determination procedure, according to various embodiments.

FIG. 12A illustrates a first portion of a representation 1200 of an electrical component (such as the PCB 500 (FIG. 5), the PCB 600 (FIG. 6), and/or the PCB 700 (FIG. 7)), as utilized by a simulation tool for simulation tool-based dielectric coating thickness determination procedure, according to various embodiments. The representation 1200 can be utilized to determine the dielectric coating thickness for conductors to be implemented in a differential configuration.

The representation 1200 includes substrate definition information 1202. The substrate definition information 1202 includes information defining characteristics of a substrate, such as the substrate 502 (FIG. 5), the substrate 602 (FIG. 6), and/or the substrate 702 (FIG. 7). For example, the substrate information 1202 defines a thickness of the substrate and a dielectric constant of the substrate.

The representation 1200 further includes simulation parameter information 1204. The simulation parameter information 1204 includes information defining the simulation to be performed by the simulation tool. For example, the simulation parameter information 1204 defines a frequency range and a size of increment for frequencies of signals to be applied to conductors of the representation 1200 to produce an output of the simulation.

The representation 1200 further includes variable information 1206. The variable information 1206 includes information defining characteristics of a dielectric coating (such as the dielectric coating 526 (FIG. 5), the dielectric coating 612 (FIG. 2), and/or the dielectric coating 718 (FIG. 7)) to be formed on the electrical component. For example, the variable information 1206 includes a dielectric constant of the dielectric coating, and a thickness range and size of increment for thicknesses of the dielectric coating to be tested.

Figure 12B:
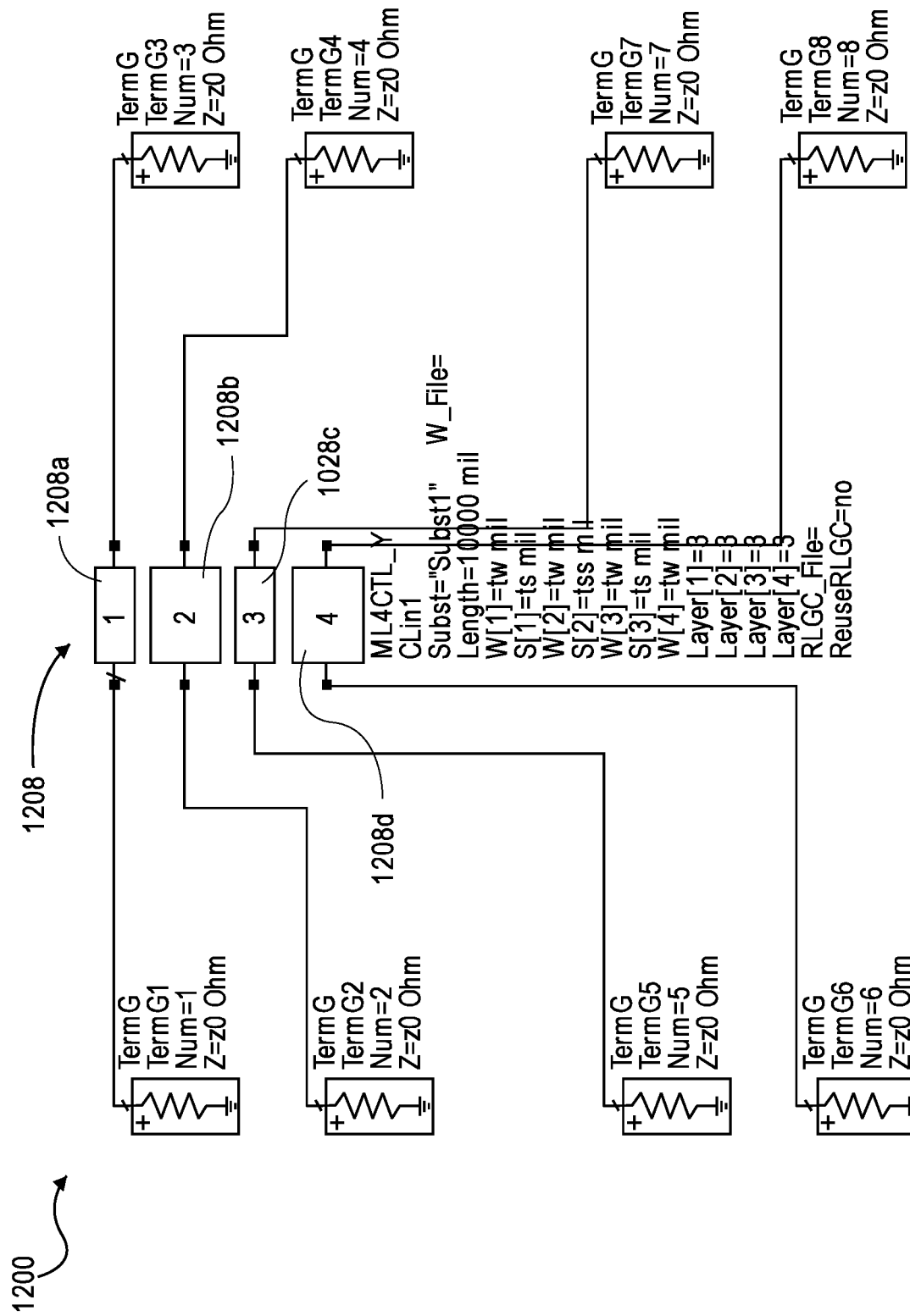
FIG. 12B illustrates a second portion of the representation of FIG. 12A, according to various embodiments.

FIG. 12B illustrates a second portion of the representation 1200 of FIG. 12A, according to various embodiments. The representation 1200 further includes conductor information 1208. The conductor information 1208 includes information related to a first pair of conductors (such as the first pair of conductors 508 (FIG. 5), the first pair of conductors 604 (FIG. 6), and/or the first pair of conductors 708 (FIG. 7)) and a second pair of conductors (such as the second pair of conductors 510 (FIG. 5), the second pair of conductors 606 (FIG. 6), and/or the second pair of conductors 710 (FIG. 7)). In particular, the conductor information 1208 includes a representation 1208a of the first conductor and a representation 1208b of the second conductor of the first pair of conductors. Further, the conductor information 1208 includes a representation 1208c of the first conductor and a representation 1208d of the second pair of conductors. The conductor information 1208 includes thicknesses of the first pair of conductors and the second pair of conductors, widths of the first pair of conductors and the second pair of conductors, distances between the conductors within the first pair of conductors and the second pair of conductors, a distance between the first pair of conductors and the second pair of conductors, or some combination thereof.

Figure 13:
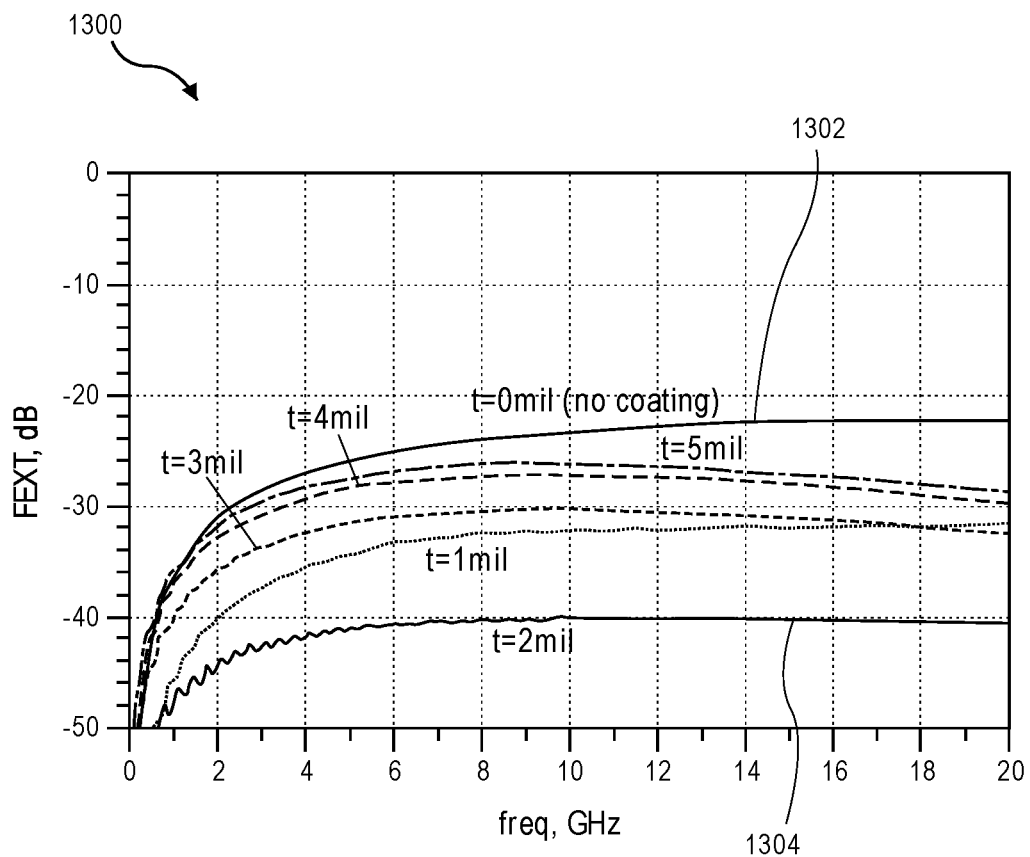
FIG. 13 illustrates a graphical representation of a result of the simulation tool-based dielectric coating thickness determination procedure for the representation of FIGS. 12A and 12B, according to various embodiments.

FIG. 13 illustrates a graphical representation 1300 of a result of the simulation tool-based dielectric coating thickness determination procedure for the representation 1200 of FIGS. 12A and 12B, according to various embodiments. In particular, the graphical representation 1300 illustrates an amount of FEXT in decibels (dB) experienced by the conductors versus the frequency of the signal applied to the conductors based on the simulation described in relation to FIGS. 12A and 12B. The graphical representation 1300 illustrates the results of the simulation for thicknesses of the dielectric coating between 0 millimeters and 5 millimeters. The graphical representation 1300 can be produced by the simulation tool.

The graphical representation 1300 includes a line 1302 that illustrates the amount of FEXT experienced by the conductors when the thickness of the dielectric coating is zero millimeters, which is equivalent to no dielectric coating being applied. As can be seen by the line 1302, the amount of FEXT experienced by the conductors approaches −20 dB for higher frequencies of signals being applied to the conductors.

As can be seen from the graphical representation 1300, the amount of FEXT can be reduced as the thickness of the dielectric coating is varied. In the illustrated embodiment, a thickness of the dielectric coating equal to 2 millimeters, represented by line 1304, presents the lowest amount of FEXT experienced by the conductors. In particular, the conductors experience an amount of FEXT around −40 dB when the dielectric coating has a thickness equal to 2 millimeters. Based on the dielectric coating of 2 millimeters presenting the lowest amount of FEXT, the thickness for the dielectric coating to be applied to the PCB is determined to be 5 millimeters.

Figure 14:
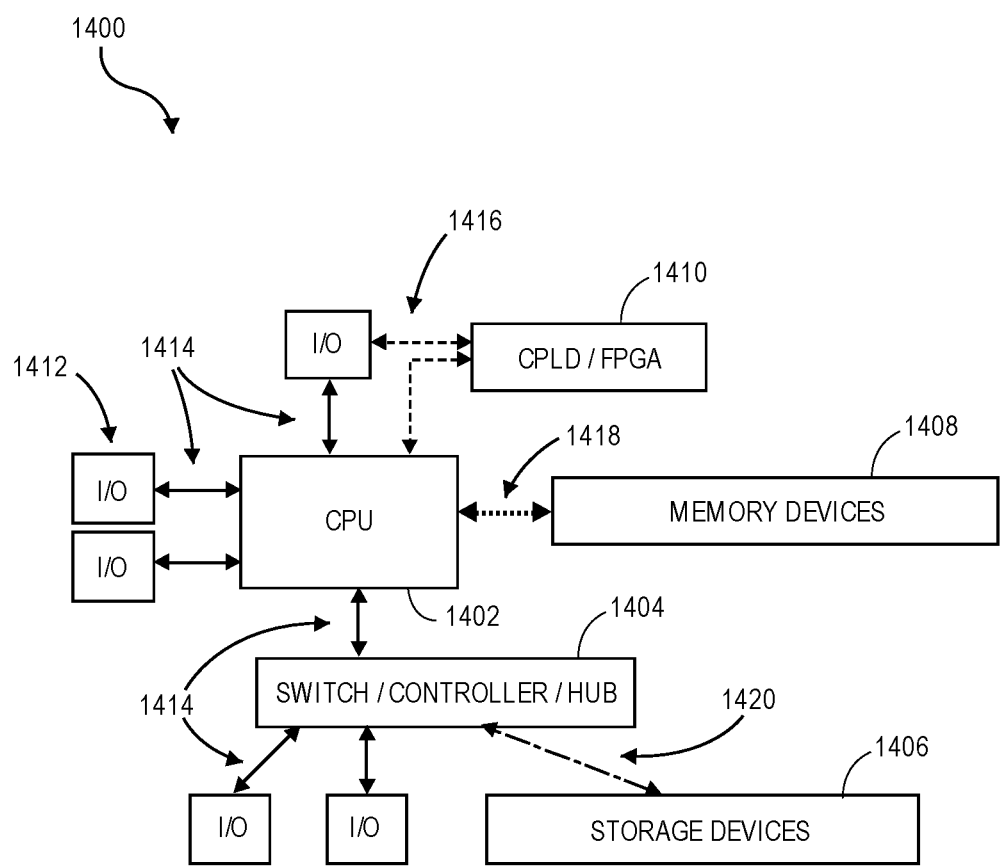
FIG. 14 illustrates a portion of a computer device, according to various embodiments.

FIG. 14 illustrates a portion of a computer device 1400, according to various embodiments. The computer device 1400 includes one or more communication links or buses. One or more of the communication links or buses can have dielectric coating (such as the dielectric coating 120 (FIG. 1), the dielectric coating 210 (FIG. 2), the dielectric coating 526 (FIG. 5), the dielectric coating 612 (FIG. 6), and/or the dielectric coating 718 (FIG. 7)) applied on the communication links or buses. The thickness of the dielectric coating on the communication links or buses may vary based on the protocol of the signals to be transmitted on the communication links or buses, or based on the configuration (i.e., single-ended configuration or differential configuration) for the communication links or buses. For example, the communication links or buses can implement DDR interfaces, PCIe, USB, SAS/SATA, or some combination thereof. The communication links or buses that implement DDR interfaces can be single-ended configured and can have different thicknesses of dielectric coating from differential configured interfaces, such as PCIe or Ethernet. Further, some of the differential configured interfaces, such as PCIe, may have different thicknesses of dielectric coating from Ethernet and/or SAS/SATA interfaces.

Further, the computer device 1400 includes one or more electrical components coupled to each other via the communication links or buses. In the illustrated embodiment, the computer device 1400 includes a computer processing unit (CPU) 1402, a switch/controller/hub 1404, one or more storage devices 1406, one or more memory devices 1408, a complex programmable logic device (CPLD)/field-programmable gate array (FPGA) 1410, and a plurality of input/output (I/O) devices 1412. The storage devices 1406 can include solid-state drives (SSDs), hard disk drives (HDDs), or some combination thereof. The memory devices 1408 can include dynamic random-access memory (DRAM), non-volatile random-access memory (NVRAM), or some combination thereof.

The computer device 1400 includes a plurality of communication links or buses 1414 that couple the CPU 1402, the switch/controller/hub 1404, and the I/O devices 1412. In some embodiments, the communication links or buses 1414 may conduct signals according to PCIe, USB, or Ethernet protocols. The computer device 1400 further includes a couple of communication links or buses 1416 that couples the CPLD/FPGA 1410 with the CPU 1402 and one of the I/O devices 1412. The computer device 1400 further includes a communication link or bus 1418 that couples the memory devices 1408 with the CPU 1402. In some embodiments, the communication link or bus 1418 may conduct signals according to DDR protocol. The computer device 1400 further includes a communication link or bus 1420 that couples the storage devices 1406 and the switch/controller/hub 1404. In some embodiments, the communication link or bus 1420 may conduct signals according to NVMe or SAS/SATA protocols. Thicknesses of dielectric coating on the communication links or buses 1414, the communication links or buses 1416, the communication link or bus 1418, and the communication link or bus 1420 varies. The thicknesses of the dielectric coating varies based on the protocols of the signals conducted by and/or the configurations of the communication links or buses 1414, the communication links or buses 1416, the communication link or bus 1418, and the communication link or bus 1420.

FIG. 15 illustrates an example semiconductor package 1500, according to various embodiments. The semiconductor package 1500 includes one or more substrates 1502. In the illustrated embodiment, the semiconductor package 1500 includes a first substrate 1502a and a second substrate 1502b. The substrates 1502 can include dielectric material with one or more conductive features (such as conductive layers, vias, and/or traces) formed in the dielectric material. The conductive features can include a plurality of conductors 1504, including a first pair of conductors 1504a, a second pair of conductors 1504b, a third pair of conductors 1504c, and a fourth pair of conductors 1504d. The conductors 1504 comprise microstrip conductors. The conductors 1504 can include one or more of the features of the first conductor 106 (FIG. 1), the second conductor 108 (FIG. 1), the first conductor 204 (FIG. 2), the second conductor 206 (FIG. 2), the first pair of conductors 508 (FIG. 5), the second pair of conductors 510 (FIG. 5), the first pair of conductors 604 (FIG. 6), the second pair of conductors 606 (FIG. 6), the first pair of conductors 708 (FIG. 7), and/or the second pair of conductors 710 (FIG. 7).

The semiconductor package 1500 further includes one or more dies 1506, including first die 1506a, second die 1506b, third die 1506c, fourth die 1506d, fifth die 1506e, and sixth die 1506f. The dies 1506 are coupled to the substrates 1502 via conductive interconnects 1508, such as ball grid arrays and/or land grid arrays. The dies 1506 can be mounted to different sides of the substrates 1502. In particular, the first die 1506a, the second die 1506b, and the third die 1506c are mounted to a first side of the first substrate 1502a, and the fourth die 1506d, fifth die 1506e, and sixth die 1506f are mounted to a second side of the first substrate 1502a that is opposite to the first side. The conductors 1504 extend among the conductive interconnects 1508 and couple the dies 1506 to each other.

The semiconductor package 1500 further includes one or more dielectric coatings 1510 located on the conductors 1506. In particular, the semiconductor package 1500 includes a first dielectric coating 1510a located on the first pair of conductors 1504a, a second dielectric coating 1510b located on the second pair of conductors 1504b, a third dielectric coating 1510c located on the third pair of conductors 1504c, and a fourth dielectric coating 1510d located on the fourth pair of conductors 1504d in the illustrated embodiment. The dielectric coatings 1510 can include one or more features of the dielectric coating 120 (FIG. 1), the dielectric coating 210 (FIG. 2), the dielectric coating 526 (FIG. 5), the dielectric coating 612 (FIG. 6), and/or the dielectric coating 718 (FIG. 7). The thicknesses of each of the dielectric coatings 1510 is selected via the procedure for selecting a dielectric coating thickness of single-ended configured conductors (as described in relation to FIG. 1 and FIG. 2) or the procedure for selecting a dielectric coating thickness of differential configured conductors (as described in relation to FIG. 5, FIG. 6, and FIG. 7). Each of the dielectric coatings 1510 can have approximately (within 25%) a uniform thickness. Each of the dielectric coatings 1510 may have the same thickness, may have different thicknesses, or some combination thereof.

Figure 16:
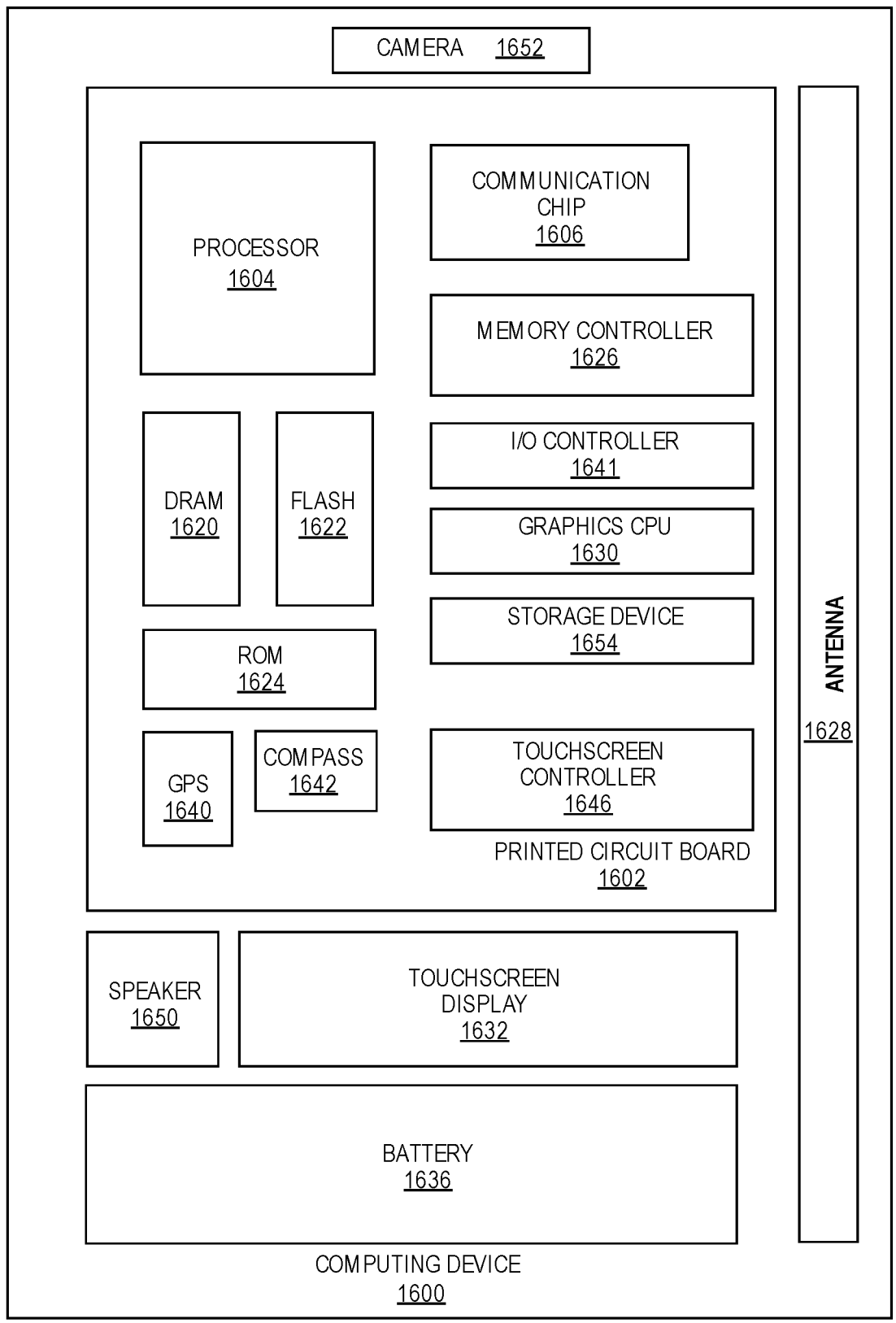
FIG. 16 illustrates an example computer device that may employ the apparatuses and/or methods described herein, in accordance with various embodiments.

FIG. 16 illustrates an example computer device 1600 that may employ the apparatuses and/or methods described herein (e.g., the PCB 100, the PCB 200, the PCB 500, the PCB 600, the PCB 700, the PCB 900, and the semiconductor package 1500), in accordance with various embodiments. As shown, computer device 1600 may include a number of components, such as one or more processor(s) 1604 (one shown) and at least one communication chip 1606. In various embodiments, the one or more processor(s) 1604 each may include one or more processor cores. In various embodiments, the at least one communication chip 1606 may be physically and electrically coupled to the one or more processor(s) 1604. In further implementations, the communication chip 1606 may be part of the one or more processor(s) 1604. In various embodiments, computer device 1600 may include printed circuit board (PCB) 1602. For these embodiments, the one or more processor(s) 1604 and communication chip 1606 may be disposed thereon. In alternate embodiments, the various components may be coupled without the employment of PCB 1602.

Depending on its applications, computer device 1600 may include other components that may or may not be physically and electrically coupled to the PCB 1602. These other components include, but are not limited to, memory controller 1626, volatile memory (e.g., dynamic random access memory (DRAM) 1620, non-volatile memory such as read only memory (ROM) 1624, flash memory 1622, storage device 1654 (e.g., a hard-disk drive (HDD)), an I/O controller 1641, a digital signal processor (not shown), a crypto processor (not shown), a graphics processor 1630, one or more antenna 1628, a display (not shown), a touch screen display 1632, a touch screen controller 1646, a battery 1636, an audio codec (not shown), a video codec (not shown), a global positioning system (GPS) device 1640, a compass 1642, an accelerometer (not shown), a gyroscope (not shown), a speaker 1650, a camera 1652, and a mass storage device (such as hard disk drive, a solid state drive, compact disk (CD), digital versatile disk (DVD)) (not shown), and so forth.

In some embodiments, the one or more processor(s) 1604, flash memory 1622, and/or storage device 1654 may include associated firmware (not shown) storing programming instructions configured to enable computer device 1600, in response to execution of the programming instructions by one or more processor(s) 1604, to execute an operating system and one or more applications. In various embodiments, these aspects may additionally or alternatively be implemented using hardware separate from the one or more processor(s) 1604, flash memory 1622, or storage device 1654.

In various embodiments, the PCB 1602 includes one or more of the features of the PCB 100 (FIG. 1), the PCB 200 (FIG. 2), the PCB 500 (FIG. 5), the PCB 600 (FIG. 6), the PCB 700 (FIG. 7), and/or the PCB 900 (FIG. 9). In particular, the PCB 1602, or some portion thereof, can include a dielectric coating, such as the dielectric coating 120 (FIG. 1), the dielectric coating 210 (FIG. 2), the dielectric coating 526 (FIG. 5), the dielectric coating 612 (FIG. 6), the dielectric coating 718 (FIG. 7), and/or the dielectric coating 912 (FIG. 9). In some embodiments, one or more of the components (such as the memory controller 1626, the I/O controller 1641, and/or the touch screen controller 1646) of the computer device 1600 can include a PCB that includes one or more of the features of the PCB 100 (FIG. 1), the PCB 200 (FIG. 2), the PCB 500 (FIG. 5), the PCB 600 (FIG. 6), the PCB 700 (FIG. 7), and/or the PCB 900 (FIG. 9).

Further, the PCB 1602 includes a plurality of conductors, such as the first conductor 106 (FIG. 1), the second conductor 108 (FIG. 1), the first conductor 204 (FIG. 2), the second conductor 206 (FIG. 2), the first pair of conductors 508 (FIG. 5), the second pair of conductors 510 (FIG. 5), the first pair of conductors 604 (FIG. 6), the second pair of conductors 606 (FIG. 6), the first pair of conductors 708 (FIG. 7), the second pair of conductors 710 (FIG. 7), the first conductor 908 (FIG. 9), and/or the second conductor 910 (FIG. 9). The plurality of conductors can couple one or more of the components mounted to the PCB 1602. One or more of the components mounted to the PCB 1602 can include circuitry that is disposed on a substrate of the PCB 1602 and can communicate in accordance with peripheral component interconnect express (PCIe) protocol. The dielectric coating of the PCB can have a thickness selected to keep a thickness of the PCB in compliance with PCIe thickness requirement. In some embodiments, the conductors may include double data rate buses, PCIe buses, Ethernet buses, serial attached small computer systems interface buses, serial advanced technology attachment buses, universal serial buses, or some combination thereof.

In some embodiments, one or more of the components of the computer device 1600 may include semiconductor packages, which may include one or more of the features of the semiconductor package 1500 (FIG. 15). For example, the processor 1604, the DRAM 1620, the flash memory 1622, the ROM 1624, the GPS 1640, the compass 1642, the communication chip 1606, the memory controller 1626, the I/O controller 1641, the graphics CPU 1630, the storage devices 1654, the touch screen controller 1646, or some combination thereof can include one or more semiconductor packages that include dielectric coatings, such as the dielectric coatings 1510 (FIG. 15) of the semiconductor package 1500.

The communication chips 1606 may enable wired and/or wireless communications for the transfer of data to and from the computer device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1600 may include a plurality of communication chips 1606. For instance, a first communication chip 1606 may be dedicated to shorter range wireless communications such as Wi-Fi and Bluetooth, and a second communication chip 1606 may be dedicated to longer range wireless communications such as GPS, EDGE, GPRS, CDMA, WiMAX, LTE, Ev-DO, and others.

In various embodiments, one or more elements, such as dram 1620, flash 1622, communication chip 1606, and so forth, may be coupled to PCB 1602, via a daughter (add-on) card. The daughter/add-on card may be formed in accordance with teachings of the present disclosure to reduce crosstalk.

In various implementations, the computer device 1600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1600 may be any other electronic device that processes data.

Figure 17:
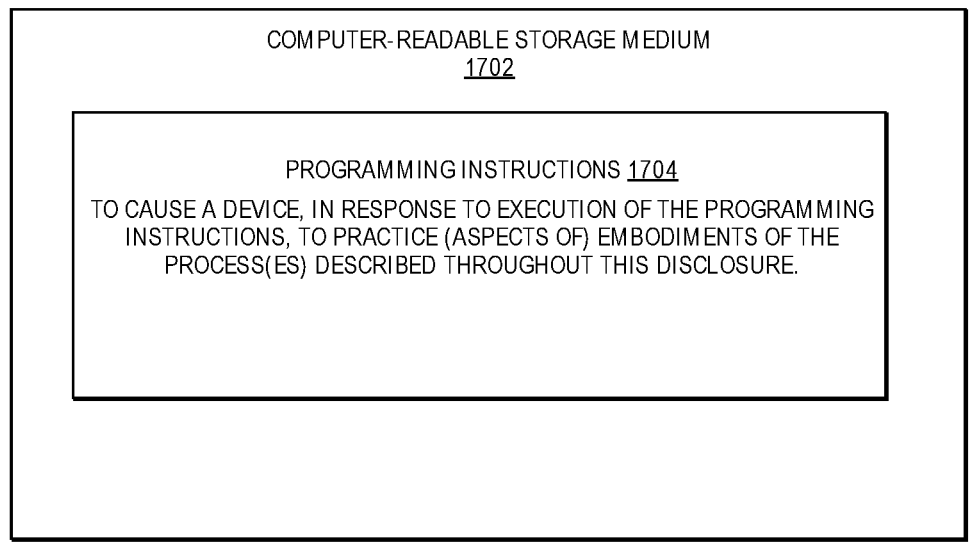
FIG. 17 illustrates an example computer-readable non-transitory storage medium that may be suitable for use to store instructions that cause an apparatus, in response to execution of the instructions by the apparatus, to practice selected aspects of the present disclosure.

As will be appreciated by one skilled in the art, aspects of the present disclosure may be embodied as methods or computer program products. Accordingly, aspects of the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium. FIG. 17 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 1702 may include a number of programming instructions 1704. Programming instructions 1704 may be configured to enable a device, e.g., computer device 1600 (FIG. 16), in response to execution of the programming instructions, to implement (aspects of) procedure 800 (FIG. 8) and/or the simulation tool-based dielectric coating thickness determination procedure. In alternate embodiments, programming instructions 1704 may be disposed on multiple computer-readable non-transitory storage media 1702 instead. In still other embodiments, programming instructions 1704 may be disposed on computer-readable transitory storage media 1702, such as signals.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Example 1 may include a printed circuit board (PCB), comprising a substrate, a pair of microstrip conductors located on a surface of the substrate, a solder mask covering the surface of the substrate and the pair of microstrip conductors, and a dielectric coating located on the solder mask, the dielectric coating on an opposite side of the solder mask from the pair of microstrip conductors, wherein a thickness of the dielectric coating is selected to cause a ratio of capacitive coupling to self capacitance to be approximately equal to a ratio of inductive coupling to self inductance for each microstrip conductor of the pair of microstrip conductors.

Example 2 may include the PCB of example 1 or any other example herein, wherein the dielectric coating is approximately conformal with a surface of the solder mask, the surface of the solder mask being at an opposite side of the solder mask from the substrate.

Example 3 may include the PCB of example 2 or any other example herein, wherein the thickness of the dielectric coating is between 0.5 mils and 10 mils.

Example 4 may include the PCB of example 1 or any other example herein, wherein the thickness of the dielectric coating is a first thickness of the dielectric coating, wherein a first portion of the dielectric coating having the first thickness is located on a first portion of the solder mask that covers the pair of microstrip conductors, and wherein a second portion of the dielectric coating that is located on a second portion of the solder mask that covers the substrate has a second thickness, the second thickness being thicker than the first thickness.

Example 5 may include the PCB of example 1 or any other example herein, wherein a thickness of the dielectric coating on a portion of the solder mask is approximately uniform, the portion of the solder mask located on the pair of microstrip conductors.

Example 6 may include the PCB of example 5 or any other example herein, wherein the thickness of the dielectric coating is between 0.5 mils and 10 mils.

Example 7 may include the PCB of example 1 or any other example herein, wherein the pair of microstrip conductors is a first pair of microstrip conductors, wherein the thickness of the dielectric coating is a first thickness of the dielectric coating, wherein the PCB further includes a second pair of microstrip conductors, wherein a first portion of the dielectric coating located on the first pair of microstrip conductors has the first thickness, and wherein a second portion of the dielectric coating located on the second pair of microstrip conductors has a second thickness, the second thickness different than the first thickness.

Example 8 may include the PCB of example 1 or any other example herein, wherein the thickness of dielectric coating is based on a thickness of the pair of microstrip conductors, a distance between the pair of microstrip conductors, a thickness of the substrate, a dielectric constant of the substrate, a thickness of the solder mask, a dielectric constant of the solder mask, and a dielectric constant of the dielectric coating.

Example 9 may include the PCB of example 1 or any other example herein, wherein the PCB is a motherboard of a server or a mobile device.

Example 10 may include an electrical component, comprising a substrate, a pair of dies mounted to the substrate, a pair of microstrip conductors located on a surface of the substrate, wherein the pair of microstrip conductors couple the pair of dies, and a dielectric coating located on the surface of the substrate, wherein a thickness of the dielectric coating is selected based at least in part on a relationship of capacitive coupling to self capacitance and a relationship of inductive coupling to self inductance for each microstrip conductor of the pair of microstrip conductors.

Example 11 may include the electrical component of example 10 or any other example herein, wherein the thickness of the dielectric coating is selected to cause a ratio of the capacitive coupling to the self capacitance to be approximately equal to a ratio of the inductive coupling to the self inductance for each microstrip conductor of the pair of microstrip conductors.

Example 12 may include the electrical component of example 10 or any other example herein, wherein the thickness of the dielectric coating is based on a thickness of the pair of microstrip conductors, a distance between the pair of microstrip conductors, a thickness of the substrate, a dielectric constant of the substrate, and a dielectric constant of the dielectric coating.

Example 13 may include the electrical component of example 10 or any other example herein, wherein the thickness of the dielectric coating is approximately uniform.

Example 14 may include the electrical component of example 10 or any other example herein, wherein the pair of dies is a first pair of dies, wherein the pair of microstrip conductors is a first pair of microstrip conductors, wherein the dielectric coating is a first dielectric coating, wherein the thickness is a first thickness, wherein the electrical component further comprises a second pair of dies mounted to the substrate, a second pair of microstrip conductors located on a surface of the substrate, wherein the second pair of microstrip conductors couple the second pair of dies, and a second dielectric coating having a second thickness, the second thickness being different from the first thickness.

Example 15 may include the electrical component of example 14 or any other example herein, wherein the first pair of dies are mounted to a first side of the substrate and the second pair of dies are mounted to a second side of the substrate, the second side opposite to the first side.

Example 16 may include the electrical component of example 10 or any other example herein, wherein the electrical component is a semiconductor package.

Example 17 may include a method for producing a dielectric coating of a printed circuit board (PCB), comprising determining an inductive coupling of each microstrip conductor of a pair of microstrip conductors located on a surface of a substrate of the PCB, determining a self inductance of each microstrip conductor of the pair of microstrip conductors, calculating a quantitative correlation between the inductive coupling to the self inductance, determining a capacitive coupling of each microstrip conductor of the pair of microstrip conductors, determining a thickness of the dielectric coating based at least in part on a quantitative correlation of the capacitive coupling to a self capacitance of each microstrip conductor of the pair of microstrip conductors and the quantitative correlation of the inductive coupling to the self inductance, and forming the dielectric coating on a surface of the PCB, the pair of microstrip conductors being located between the surface of the substrate and the surface of the PCB and the dielectric coating having the thickness.

Example 18 may include the method of example 17 or any other example herein, wherein the quantitative correlation of the capacitive coupling to the self capacitance is a ratio of the capacitive coupling to the self capacitance, wherein the quantitative correlation of the inductive coupling to the self inductance is a ratio of the inductive coupling to the self inductance, and wherein determining the thickness of the dielectric coating includes selecting the thickness of the dielectric coating to cause a ratio of the capacitive coupling to the self capacitance to be approximately equal to a ratio of the inductive coupling to the self inductance.

Example 19 may include the method of example 17 or any other example herein, wherein the inductive coupling, the self inductance, and the capacitive coupling are determined based on a thickness of the pair of microstrip conductors, a width of the pair of microstrip conductors, and a distance between the pair of microstrip conductors.

Example 20 may include the method of example 17 or any other example herein, wherein determining the inductive coupling, the self inductance, and the capacitive coupling is performed by a simulator based on characteristics of the PCB provided to the simulator, and wherein determining the thickness of the dielectric coating includes arranging the simulator to increment through a plurality of thicknesses for the dielectric coating, causing the simulator to determine an amount of far end crosstalk (FEXT) of the pair of microstrip conductors for each thickness within the plurality of thicknesses, and determining the thickness of the dielectric coating to be one of the thicknesses from the plurality of thicknesses that produces a lowest amount of FEXT.

Example 21 may include an apparatus to perform the method of any of examples 17-20, or any other example herein.

Example 22 may include an apparatus comprising means for performing the method of any of example 17-20 or any other example herein.

Example 23 may include one or more non-transitory, computer-readable media having instructions stored thereon, wherein the instructions, in response to execution by a user equipment (UE) cause the UE to perform the method of any of examples 17-20, or any other example herein.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A printed circuit board (PCB), comprising:
   a substrate;
   first and second microstrip conductors located on a surface of the substrate;
   a solder mask covering the surface of the substrate and the first and second microstrip conductors; and
   a dielectric coating disposed on the solder mask, on an opposite side of the solder mask from the first and second microstrip conductors, wherein a thickness of the dielectric coating is selected to provide a ratio of capacitive coupling to self capacitance for each of the first and second microstrip conductors to be approximately equal, within 25%, to a ratio of inductive coupling to self inductance for each of the first and second microstrip conductors.

2. The PCB of claim 1, wherein the dielectric coating is approximately conformal with a surface of the solder mask, the surface of the solder mask being at an opposite side of the solder mask from the substrate.

3. The PCB of claim 2, wherein the thickness of the dielectric coating is between 0.5 mils and 10 mils.

4. The PCB of claim 1, wherein the thickness of the dielectric coating is a first thickness of the dielectric coating, wherein a first portion of the dielectric coating having the first thickness is located on a first portion of the solder mask that covers the microstrip conductors, and wherein a second portion of the dielectric coating that is located on a second portion of the solder mask that covers the substrate has a second thickness, the second thickness being thicker than the first thickness.

5. The PCB of claim 1, wherein a thickness of the dielectric coating on a portion of the solder mask is approximately uniform, the portion of the solder mask located on the first and second microstrip conductors.

6. The PCB of claim 5, wherein the thickness of the dielectric coating is between 0.5 mils and 10 mils.

7. The PCB of claim 1, wherein the first and second microstrip conductors are a first pair of microstrip conductors, wherein the thickness of the dielectric coating is a first thickness of the dielectric coating, wherein the PCB further includes a second pair of microstrip conductors, wherein a first portion of the dielectric coating located on the first pair of microstrip conductors has the first thickness, and wherein a second portion of the dielectric coating located on the second pair of microstrip conductors has a second thickness, the second thickness different than the first thickness.

8. The PCB of claim 1, wherein the thickness of dielectric coating is based on a thickness of the microstrip conductors, a distance between the microstrip conductors, a thickness of the substrate, a dielectric constant of the substrate, a thickness of the solder mask, a dielectric constant of the solder mask, and a dielectric constant of the dielectric coating.

9. The PCB of claim 1, wherein the PCB is a motherboard of a server or a mobile device.

10. An electrical component, comprising:
    a substrate;
    a pair of dies mounted to the substrate;
    a pair of microstrip conductors comprising first and second microstrip conductors, located on a surface of the substrate, wherein the pair of microstrip conductors couple the pair of dies; and
    a dielectric coating disposed on a solder mask covering the surface of the substrate, wherein a thickness of the dielectric coating is selected to provide a ratio of capacitive coupling to self capacitance for each of the first and second microstrip conductors to be approximately equal, within 25%, to a ratio of inductive coupling to self inductance for each of the first and second microstrip conductors.

11. The electrical component of claim 10, wherein the thickness of the dielectric coating is based on a thickness of the pair of microstrip conductors, a distance between the pair of microstrip conductors, a thickness of the substrate, a dielectric constant of the substrate, and a dielectric constant of the dielectric coating.

12. The electrical component of claim 10, wherein the thickness of the dielectric coating is approximately uniform.

13. The electrical component of claim 10, wherein the pair of dies is a first pair of dies, wherein the pair of microstrip conductors is a first pair of microstrip conductors, wherein the dielectric coating is a first dielectric coating, wherein the thickness is a first thickness, wherein the electrical component further comprises:
    a second pair of dies mounted to the substrate;
    a second pair of microstrip conductors located on a surface of the substrate, wherein the second pair of microstrip conductors couple the second pair of dies; and
    a second dielectric coating having a second thickness, the second thickness being different from the first thickness.

14. The electrical component of claim 13, wherein the first pair of dies are mounted to a first side of the substrate and the second pair of dies are mounted to a second side of the substrate, the second side opposite to the first side.

15. The electrical component of claim 10, wherein the electrical component is a semiconductor package.

16. A method for producing a dielectric coating of a printed circuit board (PCB), comprising:
    determining an inductive coupling of first and second microstrip conductors of a pair of microstrip conductors located on a surface of a substrate of the PCB;
    determining a self inductance of the first and second microstrip conductor of the pair of microstrip conductors;
    calculating a quantitative correlation between the inductive coupling to the self inductance;
    determining a capacitive coupling of each of the first and second microstrip conductors of the pair of microstrip conductors;
    determining a thickness of the dielectric coating based at least in part on a quantitative correlation of the capacitive coupling to a self capacitance of each of the first and second microstrip conductors and the quantitative correlation of the inductive coupling to the self inductance,
    wherein the thickness is selected to provide a ratio of the capacitive coupling to self capacitance for each of the first and second microstrip conductors to be approximately equal, within 25%, to a ratio of inductive coupling to self inductance for each of the first and second microstrip conductors to form the dielectric coating on a surface of the PCB, the pair of microstrip conductors being located between the surface of the substrate and the surface of the PCB and the dielectric coating having the thickness.

17. The method of claim 16, wherein the inductive coupling, the self inductance, and the capacitive coupling are determined based on a thickness of the first and second microstrip conductors, a width of the first and second microstrip conductors, and a distance between the first and second microstrip conductors.

18. The method of claim 16, wherein determining the inductive coupling, the self inductance, and the capacitive coupling is performed by a simulator based on characteristics of the PCB provided to the simulator, and wherein determining the thickness of the dielectric coating includes:
    arranging the simulator to increment through a plurality of thicknesses for the dielectric coating;
    causing the simulator to determine an amount of far end crosstalk (FEXT) of the first and second microstrip conductors for each thickness within the plurality of thicknesses; and
    determining the thickness of the dielectric coating to be one of the thicknesses from the plurality of thicknesses that produces a lowest amount of FEXT.

\* \* \* \* \*